United States Patent
Venugopal et al.

(10) Patent No.: US 12,334,146 B1
(45) Date of Patent: Jun. 17, 2025

(54) POWER LOSS REDUCTION IN DATA STORAGE ARRAYS

(71) Applicant: Apple Inc., Cupertino, CA (US)

(72) Inventors: Vivekanandan Venugopal, Saratoga, CA (US); Ajay Bhatia, Saratoga, CA (US); Sneha Sindhu Matam, Austin, TX (US); Raymond Chang, Austin, TX (US)

(73) Assignee: Apple Inc., Cupertino, CA (US)

( * ) Notice: Subject to any disclaimer, the term of this patent is extended or adjusted under 35 U.S.C. 154(b) by 122 days.

(21) Appl. No.: 18/324,797

(22) Filed: May 26, 2023

Related U.S. Application Data

(60) Provisional application No. 63/376,886, filed on Sep. 23, 2022.

(51) Int. Cl.
| | | |
|---|---|---|
| G11C 11/41 | (2006.01) | |
| G11C 5/14 | (2006.01) | |
| G11C 11/419 | (2006.01) | |

(52) U.S. Cl.
CPC .............. *G11C 11/419* (2013.01); *G11C 5/14* (2013.01)

(58) Field of Classification Search
CPC .................................. G11C 11/419; G11C 5/14
See application file for complete search history.

(56) References Cited

U.S. PATENT DOCUMENTS

| | | | |
|---|---|---|---|
| 6,522,598 B2 | 2/2003 | Ooishi | |
| 8,000,156 B2 | 8/2011 | Van Winkelhoff et al. | |
| 9,928,323 B2 | 3/2018 | Wilson | |
| 10,088,886 B2 | 10/2018 | Tamura | |
| 11,003,238 B2 | 5/2021 | Sundararajan et al. | |
| 11,037,622 B2 | 6/2021 | Atsumi et al. | |
| 2014/0153320 A1* | 6/2014 | Yamagami | G11C 11/413 365/154 |
| 2018/0284874 A1* | 10/2018 | Sundararajan | G06F 1/3275 |
| 2019/0101952 A1 | 4/2019 | Diamond et al. | |
| 2019/0227807 A1 | 7/2019 | Martin et al. | |
| 2021/0118479 A1 | 4/2021 | Choi et al. | |

* cited by examiner

*Primary Examiner* — Xiaochun L Chen
(74) *Attorney, Agent, or Firm* — Kowert, Hood, Munyon, Rankin & Goetzel, P.C.; Gentry C. McLean; Dean M. Munyon

(57) ABSTRACT

A memory circuit including a storage array circuit and a control circuit is disclosed. The control circuit may select a particular row of storage circuits in the storage array circuit and activate a first-stage circuit in a particular storage circuit in the particular row by coupling the first-stage circuit to a power supply node. At a later point in time, the control circuit may initiate a transfer of write data from the first-stage circuit to a second-stage circuit in the particular storage circuit and de-activate the first-stage circuit by de-coupling the first-stage circuit from the power supply node. Additionally, the control circuit may also de-select the particular row, at a different point in time, and maintain a de-activated state of the first-stage circuit until a subsequent selection of the particular row.

20 Claims, 19 Drawing Sheets

POWER LOSS REDUCTION IN DATA STORAGE ARRAYS

CROSS-REFERENCE TO RELATED APPLICATIONS

The present application claims priority to U.S. Provisional App. No. 63/376,886 entitled "Power Loss Reduction in Data Storage Arrays," filed Sep. 23, 2022, the disclosure of which is incorporated by reference herein in its entirety.

BACKGROUND

Technical Field

Embodiments described herein relate to data storage circuits for integrated circuits, and more particularly, to techniques for reducing power loss by flip-flop arrays.

Description of the Related Art

Modern computer systems can include a hierarchy of storage or memory circuits to store program instructions and data. Such memory circuits may be either volatile or non-volatile and have varying access speeds and storage capacities. For example, high-capacity memory circuits with longer access times, e.g., solid-state disc drives, are used to store infrequently used program instructions and data.

Processor circuits can include multiple memory circuits of varying storage densities and access times. In some cases, multiple cache memory circuits may be employed to store frequently used program instructions and data. Such cache memory circuits may be implemented using static random-access memory (SRAM) storage cells.

In some cases, a processor circuit may employ smaller amounts of memory than can be implemented with a standard SRAM architecture. Such memories are commonly implemented using a register file, multiple latches, or an array of flip-flop circuits (referred to as a "flop array").

Figure 1:
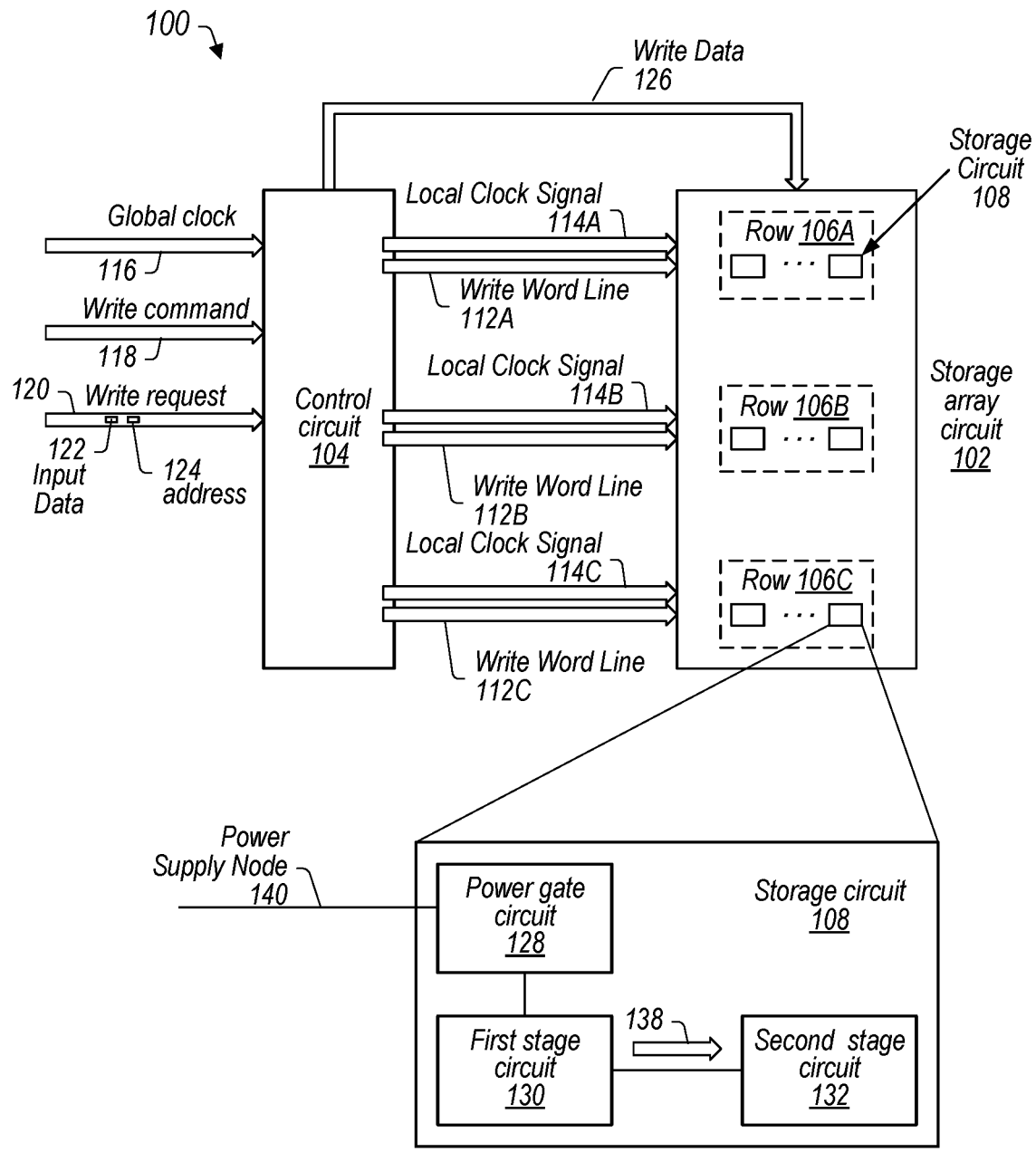
FIG. 1 is a block diagram illustrating an embodiment of a memory circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

In some cases, a processor circuit may store only a small amount of data. For example, a processor circuit may need to temporarily store a few operands while waiting for a previous result before the few operands can be processed. In such cases, a full-featured memory circuit implemented using a SRAM architecture may exceed area and power consumption design targets. To meet such design targets, smaller memory circuits can be implemented using flop-array circuits.

Flop-array circuits are implemented using multiple flip-flop circuits arranged in multiple rows, where the flip-flop circuits in a particular row are coupled to a common word line signal. A decoder circuit can be used to decode an address to selectively activate a particular word line during read or write operations. The overhead to implement flop-array circuits can be less than SRAM-based memory circuits for small storage capacities. In addition to not requiring sensing circuits, the flip-flop circuits used in a flop-array circuit can be added to the scan chain for other latch and flip-flop circuits in an integrated circuit reducing testing overhead and eliminating the need for a built-in self-test (BIST) circuits.

Flop-array circuits, however, are not without drawbacks. Since a given input data line is connected to a corresponding flip-flop circuit in each row of a flop-array circuit, logic circuits driving the flop-array circuit can have a considerable load. This can result in larger driver circuits in the logic circuit or the addition of buffer stages with large drivers. Either solution can negatively impact timing, circuit area, and/or power consumption.

In addition to the problems associated with the large input load, flop-array circuits can have large leakage currents. A flip-flop circuit includes two latch stages that operate together to store a bit of information. Typically, only one of the two latch stages is storing data at any given time, while the other stage is in a transparent mode. While both latch stages in a flip-flop contribute to the leakage current, only one of the latch stages is actually storing data so the leakage current can be larger than SRAM-based designs where only a single pair of cross-coupled inverters is used to store data.

The embodiments described herein deactivate a first stage circuit of a flip-flop storage element, or storage circuit, which is not selected for a write in a flop-array circuit. When the first stage circuit is deactivates, it is not responsive, or at least less responsive, to changes in data at its input; variations in data at the input of the first stage circuit do not cause logic levels within the first stage circuit to change. By deactivating the first-stage circuit of a storage circuit when not selected for a write, power dissipated by the flop-array circuit can be reduced.

A block diagram of a memory circuit is depicted in FIG. 1. As illustrated, memory circuit 100 includes storage array circuit 102 and control circuit 104. Storage array circuit 102 includes multiple ones of storage circuit 108 arranged in rows 106A-106C that are configured to store write data 126 in response to an activation of corresponding ones of write word lines 112A-112C. Although storage array circuit 102 is depicted as including only three rows, in other embodiments, any suitable number of rows may be employed.

Control circuit 104 is configured to receive global clock signal 116, write command 118, and write request 120, which includes input data 122 and address 124. As described below, control circuit 104 may be configured to latch input data 122 to generate write data 126. Control circuit 104 is configured to activate a particular write word line of write word lines 112A-112C using address 124 in response to an activation of write command 118 and a first transition of global clock signal 116. In various embodiments, the first transition of global clock signal 116 is from a first logical value to a second logical value. In some embodiments, a first voltage level corresponding to the first logical value is lower than a second voltage level corresponding to the second logical value. In various embodiments, control circuit 104 is further configured to activate a particular local clock signal of local clock signals 114A-114C using the particular write word line.

Storage circuit 108 includes power gate circuit 128, first-stage circuit 130, and second stage circuit 132. As described below, storage circuit 108 is configured to transfer write data portion 138 from first-stage circuit 130 to second-stage circuit 132 in response to the activation of a corresponding local clock signal of local clock signals 114A-114C.

Power gate circuit 128 is configured to couple at least a portion of first-stage circuit 130 to power supply node 140 in response to an activation of the particular write word line. Power gate circuit 128 is further configured to de-couple the at least a portion of first-stage circuit 130 from power supply node 140 in response to a de-activation of the particular word line.

Figure 2:
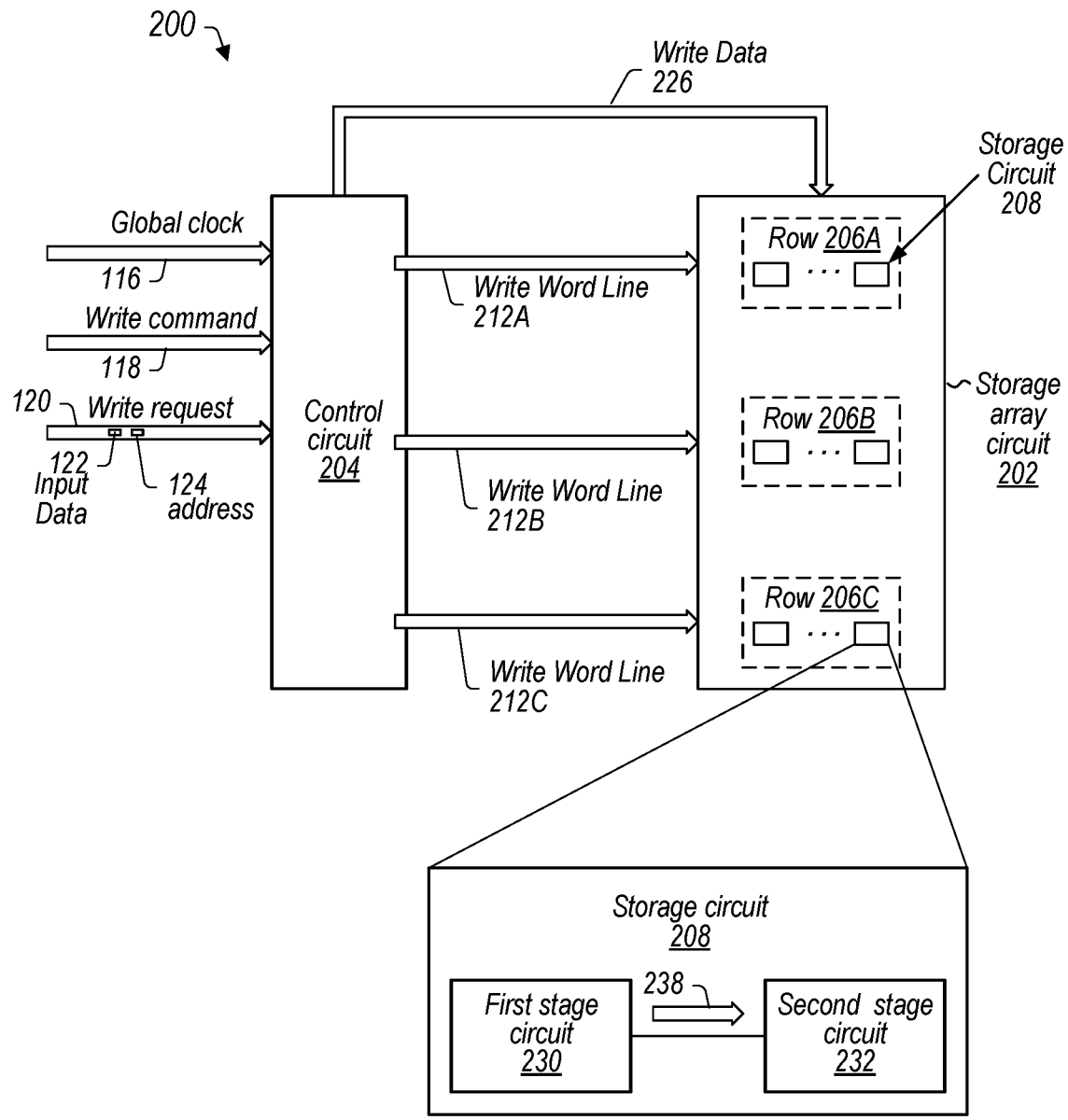
FIG. 2 is a block diagram illustrating a different embodiment of a memory circuit.

The embodiment depicted in FIG. 1 describes the use of a particular storage circuit that includes power gate circuitry. In other applications, the additional area associated with the power gate circuitry may not be practical. In such cases, alternative storage circuits may be employed. A block diagram of an embodiment of a memory circuit that makes use of an alternative storage circuit is depicted in FIG. 2. As illustrated, memory circuit 200 includes storage array circuit 202 and control circuit 204. Storage array circuit 202 includes multiple instances of storage circuit 208. In various embodiments, the multiple instances of storage circuit 208 are arranged in rows 206A-206C, which are coupled to corresponding ones of write word lines 212A-212C. Although storage array circuit 202 is depicted as including three rows, in other embodiments, storage array circuit 202 may include any suitable number of rows.

Control circuit 204 is configured to receive global clock signal 116, write command 118, and write request 120, which includes input data 122 and address 124. In various embodiments, control circuit 204 is configured to capture (or "latch") input data 122, in response to a first transition of global clock signal 116, to generate write data 226. Control circuit 204 is further configured to activate a particular write word line of write word lines 212A-212C using address 124. It is noted that although control circuit 204 is depicted as generating three write word lines, in other embodiments, control circuit 204 may be configured to generate any suitable number of write word lines. In some embodiments, the number of write word lines generated by control circuit 204 may correspond to a number of rows included in storage array circuit 202.

Storage circuit 208 includes first-stage circuit 230 and second-stage circuit 232. In various embodiments, storage circuit 208 is configured to receive a portion of write data 226 in response to an activation of the particular write word line. Storage circuit 208 is further configured to transfer the portion of write data 226 from first-stage circuit 230 to second-stage circuit 232 in response to a de-activation of the particular write word line.

Figure 3:
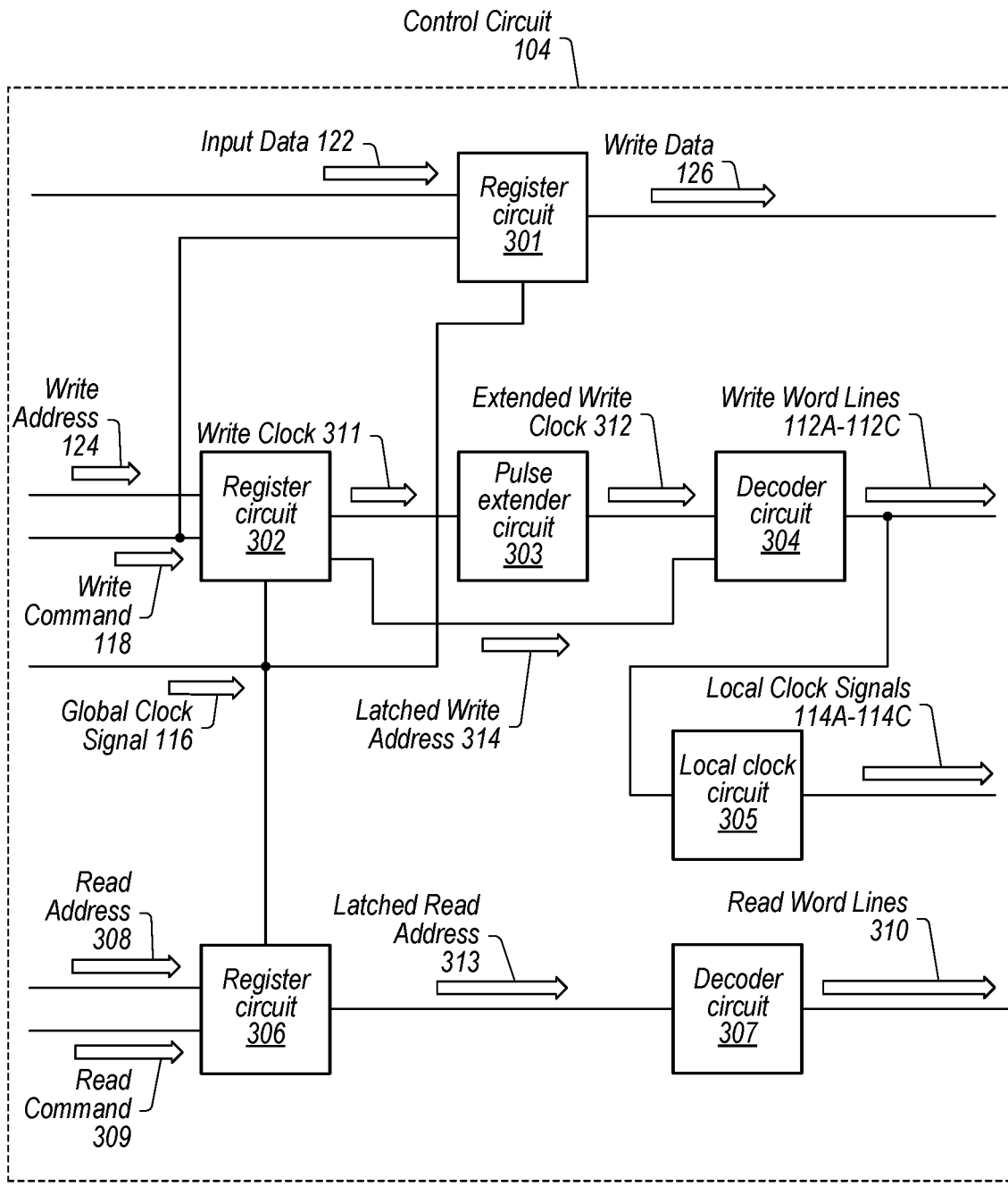
FIG. 3 is a block diagram illustrating an embodiment of a control circuit for a memory circuit.

Turning to FIG. 3, a block diagram of control circuit 104 is depicted. As illustrated, control circuit 104 includes register circuit 301, register circuit 302, pulse extender circuit 303, decoder circuit 304, local clock circuit 305, register circuit 306, and decoder circuit 307.

Register circuit 301 is configured, in response to an activation of write command 118 and a first transition of global clock signal 116, to latch input data 122 to generate write data 126. In various embodiments, register circuit 301 may be implemented using multiple latch or flip-flop circuits configured to latch corresponding bits of input data 122 on a rising-edge of global clock signal 116 when write command 118 is a logical-1. In various embodiments, a number of latch or flip-flop circuits included in register circuit 301 may correspond to a number of bits included in input data 122.

Register circuit 302 is configured, in response to an activation of write command 118 and the first transition of global clock signal 116, to latch write address 124 to generate write clock 311 and latched write address 314. In various embodiments, register circuit 302 may be implemented using multiple latch or flip-flop circuits to latch corresponding bits of write address 124 on a rising-edge of global clock signal 116. Register circuit 302 may be further configured to latch a state of write command 118 on the rising-edge of global clock signal 116 to generate write clock 311. In some embodiments, a number of latch or flip-flop circuits included in register circuit 302 may correspond to a number of bits in write address 124, plus an additional latch or flip-flop circuit to latch the state of write command 118.

Pulse extender circuit 303 is configured to generate extended write clock 312 using write clock 311. As described below, pulse extender circuit 303 may be further configured to delay a falling-edge of extended write clock 312 relative to a falling-edge of write clock 311.

Decoder circuit 304 is configured to generate write word lines 112A-112C using extended write clock 312 and latched write address 314. In various embodiments, decoder circuit 304 is configured to activate a particular write word line of write word lines 112A-112C based on which of the bits included in latched write address 314 are logical-1 s. In some embodiments, a duration of how long the particular write word line is active is based on extended write clock 312. Decoder circuit 304 may be implemented using any suitable combination of static or dynamic logic gates.

Local clock circuit 305 is configured to generate local clock signals 114A-114C using write word lines 112A-112C. In various embodiments, local clock circuit 305 may be configured, in response to an activation of a particular write word line of write word lines 112A-112C, to activate a corresponding one of local clock signals 114A-114C. As described below, local clock circuit 305 may include multiple clock gate circuits and inverter circuits, and may be further configured to generate complement versions of local clock signals 114A-114C as well.

In addition to generating signals for storing data in storage array circuit 102, control circuit 104 is further configured to generate signals for retrieving previously stored data from storage array circuit 102. As illustrated register circuit 306 and decoder circuit 307 are configured to generate such signals.

Register circuit 306 is configured, in response to an activation of read command 309 and a transition of global clock signal 116, to latch read address 308 to generate latched read address 313. In various embodiments, register circuit 306 may be implemented using multiple latch or flip-flop circuits configured to latch corresponding bits of read address 308 on a rising-edge of global clock signal 116 when read command 309 is a logical-1. In various embodiments, a number of latch or flip-flop circuits included in register circuit 306 may correspond to a number of bits included in read address 308.

Decoder circuit 307 is configured to generate read word lines 310 using latched read address 313. In various embodiments, decoder circuit 307 is configured to activate a particular read word line of read word lines 310 based on which of the bits included in latched read address 313 are logical-1s. Decoder circuit 307 may be implemented using any suitable combination of static or dynamic logic gates.

Figure 4:
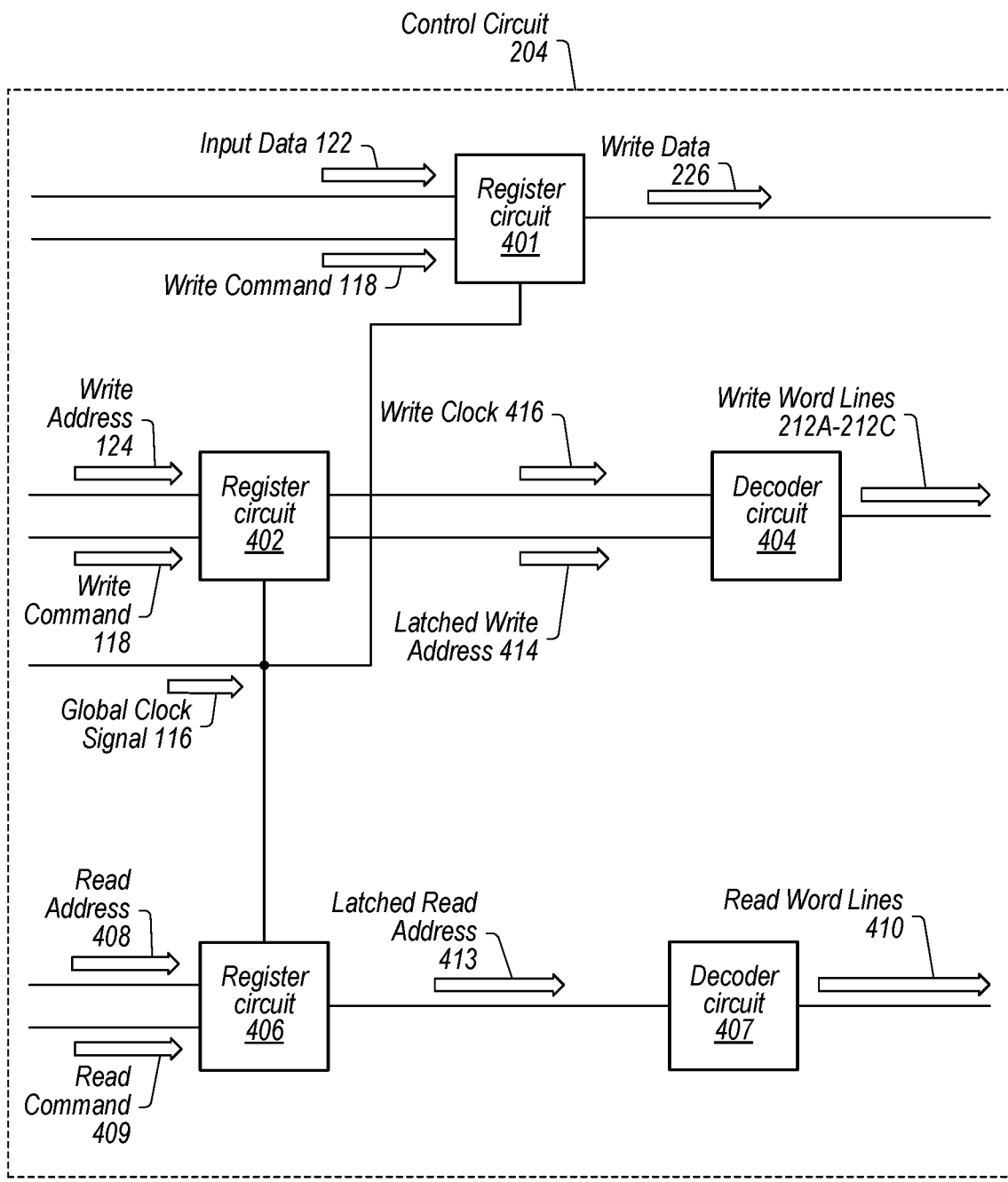
FIG. 4 is a block diagram illustrating an embodiment of a control circuit for a memory circuit.

Turning to FIG. 4, a block diagram of control circuit 204 is depicted. As illustrated, control circuit 204 includes register circuit 401, register circuit 402, decoder circuit 404, register circuit 406, and decoder circuit 407.

Register circuit 401 is configured, in response to an activation of write command 118 and a first transition of global clock signal 116, to latch input data 122 to generate write data 226. In various embodiments, register circuit 401 may be implemented using multiple latch or flip-flop circuits configured to latch corresponding bits of input data 122 on a rising-edge of global clock signal 116 when write command 118 is a logical-1. In various embodiments, a number of latch or flip-flop circuits included in register circuit 401 may correspond to a number of bits included in input data 122.

Register circuit 402 is configured, in response to an activation of write command 118 and the first transition of global clock signal 116, to latch write address 124 to generate write clock 416 and latched write address 414. In various embodiments, register circuit 402 may be implemented using multiple latch or flip-flop circuits to latch corresponding bits of write address 124 on a rising-edge of global clock signal 116. Register circuit 402 may be further configured to latch a state of write command 118 on the rising-edge of global clock signal 116 to generate write clock 416. In some embodiments, a number of latch or flip-flop circuits included in register circuit 402 may correspond to a number of bits in write address 124, plus an additional latch or flip-flop circuit to latch the state of write command 118.

Decoder circuit 404 is configured to generate write word lines 212A-212C using write clock 416 and latched write address 414. In various embodiments, decoder circuit 404 is configured to activate a particular write word line of write word lines 212A-212C based on which of the bits included in latched write address 414 are logical-1s. In some embodiments, a duration of how long the particular write word line is active is based on write clock 416. Decoder circuit 404 may be implemented using any suitable combination of static or dynamic logic gates.

Register circuit 406 is configured, in response to an activation of read command 409 and a different transition of global clock signal 116, to latch read address 408 to generate latched read address 413. In various embodiments, register circuit 406 may be implemented using multiple latch or flip-flop circuits configured to latch corresponding bits of read address 408 on a rising-edge of global clock signal 116 when read command 409 is a logical-1. In various embodiments, a number or latch of flip-flop circuits included in register circuit 406 may correspond to a number of bits included in read address 408.

Decoder circuit 407 is configured to generate read word lines 410 using latched read address 413. In various embodiments, decoder circuit 407 is configured to activate a particular read word line of read word lines 410 based on which of the bits included in latched read address 413 are logical-1s. Decoder circuit 407 may be implemented using any suitable combination of static or dynamic logic gates.

Figure 5:
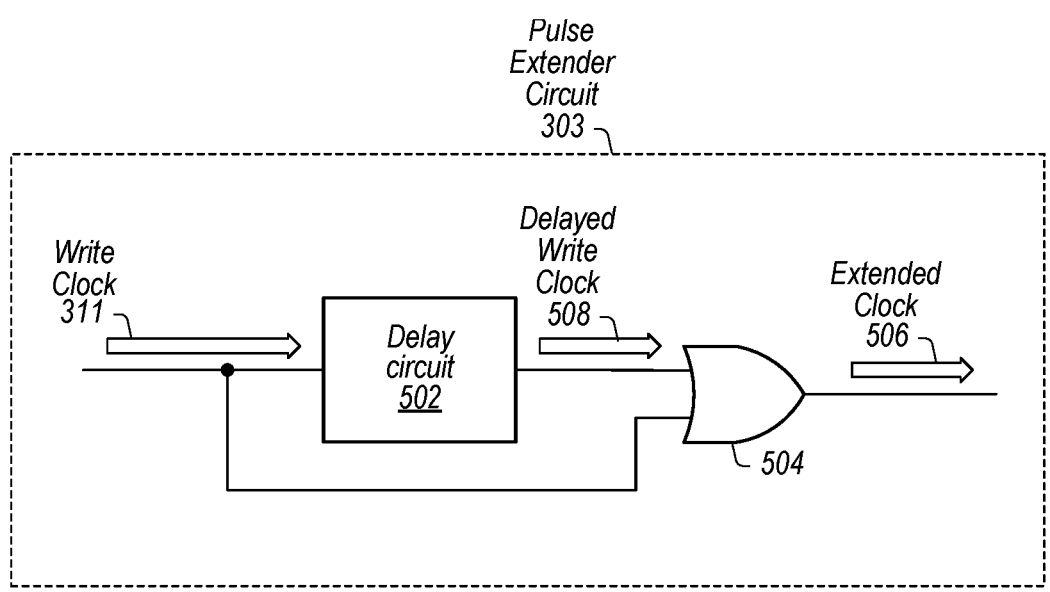
FIG. 5 is a block diagram illustrating an embodiment of a pulse extender circuit.

A block diagram of an embodiment of pulse extender circuit 303 is depicted in FIG. 5. As illustrated, pulse extender circuit 303 includes delay circuit 502 and OR-gate 504.

Delay circuit 502 is configured to generate delayed write clock 508 using write clock 311. In various embodiments, delayed write clock 508 has the same frequency as write clock 311, but each transition of delayed write clock 508 occurs a particular time period after a corresponding transition of write clock 311. The value of the particular time period is determined by the implementation of delay circuit 502.

In various embodiments, delay circuit 502 may be implemented using multiple inverter circuits or other suitable logic gate circuits coupled together in series to form a chain of logic gate circuits. In some cases, a fanout of each logic gate circuit included in the chain of logic circuits may be substantially the same so that each logic gate circuit in the chain of logic circuits provides approximately the same amount of delay.

OR-gate 504 is configured to generate extended clock 506 using delayed write clock 508 and write clock 311. To generate extended clock 506, OR-gate 504 may be further configured to perform a logical-OR operation on write clock 311 and delayed write clock 508. In various embodiments, a transition of write clock 311 from a logical-0 value to a logical-1 value generates a corresponding transition from a logical-0 value to a logical-1 value on extended clock 506. A transition of delayed write clock 508 from a logical-1 value to a logical-0 value results in a transition of extended clock 506 from a logical-1 value to a logical-0.

In some embodiments, OR-gate 504 may be implemented using a NOR-gate and an inverter circuit. In other embodiments, OR-gate 504 may be implemented as a complex logic gate or any suitable combination of logic gates implemented using complementary metal-oxide semiconductor (CMOS) or other suitable technology.

Figure 6:
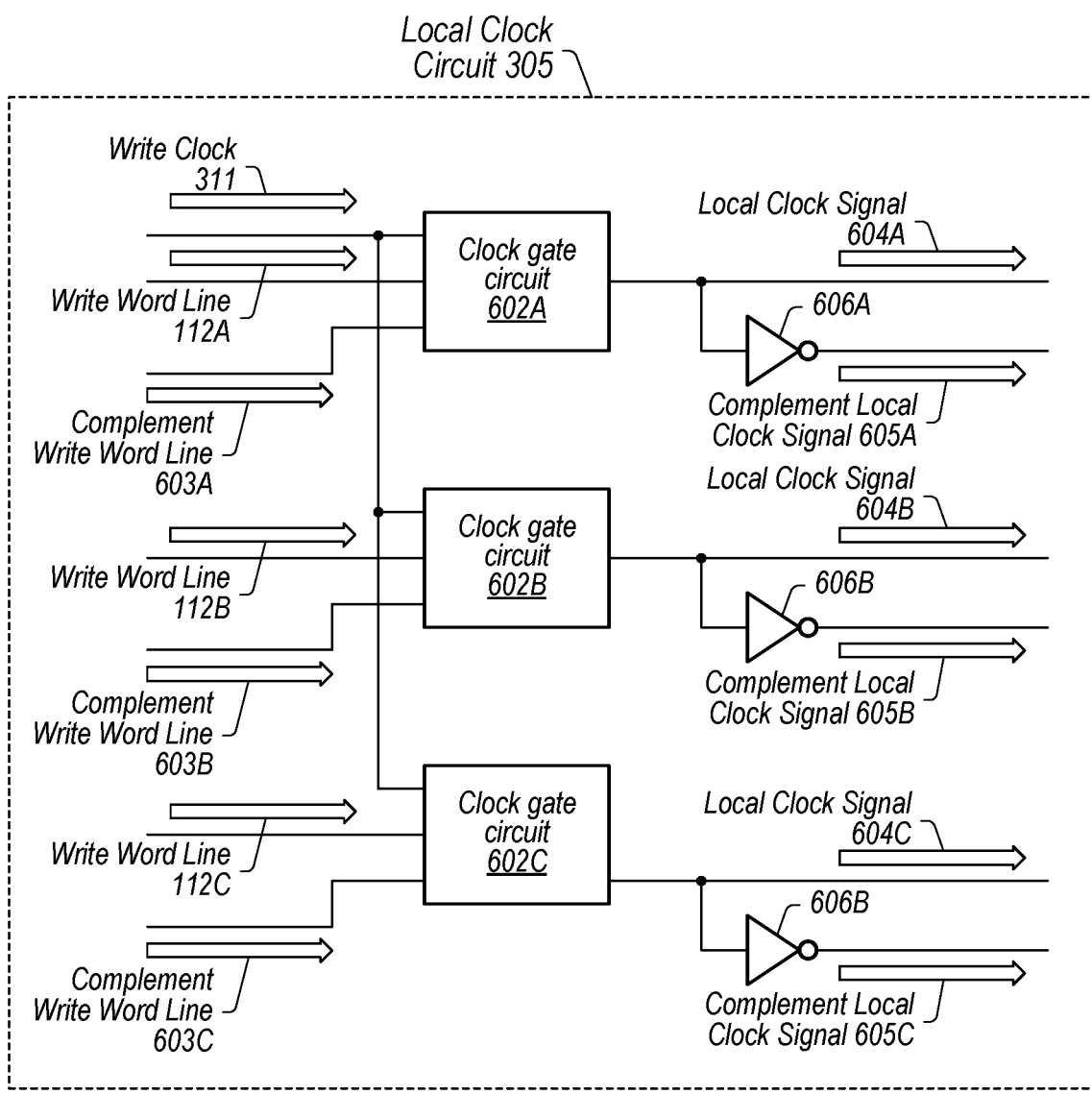
FIG. 6 is a block diagram illustrating an embodiment of a local clock circuit.

Turning to FIG. 6, a block diagram of an embodiment of local clock circuit 305 is depicted. As illustrated, local clock circuit 305 includes clock gate circuits 602A-602C, and inverters 606A-606C. It is noted that although only three clock gate circuits and three inverters are depicted in the embodiment of FIG. 6, in other embodiments, any suitable number of clock gate circuits and associated inverters may be employed. In some embodiments, the number of clock gate circuits may be based on a number of rows of storage circuits in the storage array circuit.

Clock gate circuit 602A is configured to generate local clock signal 604A using write clock 311, write word line 112A, and complement write word line 603A, and clock gate circuit 602B is configured to generate local clock signal 604B using write clock 311, write word line 112B, and complement write word line 603B. In a similar fashion, clock gate circuit 602C is configured to generate local clock signal 604C using write clock 316, write word line 112C, and complement write word line 603C. In various embodiments, complement write word lines 603A-603C may correspond to the respective complements of write word lines 112A-112C, and local clock signals 604A-604C may correspond to local clock signals 114A-114C. As described below, clock gate circuits 602A-602C may generate low-going pulses on local clock signals 604A-604C based on the relative timings of write clock 311 to complement write word lines 603A-603C.

Inverter 606A is configured to generate complement local clock signal 605A using local clock signal 604A, and inverter 606B is configured to generate complement local clock signal 605B using local clock signal 604B. In a similar fashion, inverter 606C is configured to generate complement local clock signal 605C using local clock signal 604C. In various embodiments, inverters 606A-606C may be implemented using CMOS inverters or any other suitable inverting amplifier circuits including those implemented with technologies other than CMOS.

Figure 7:
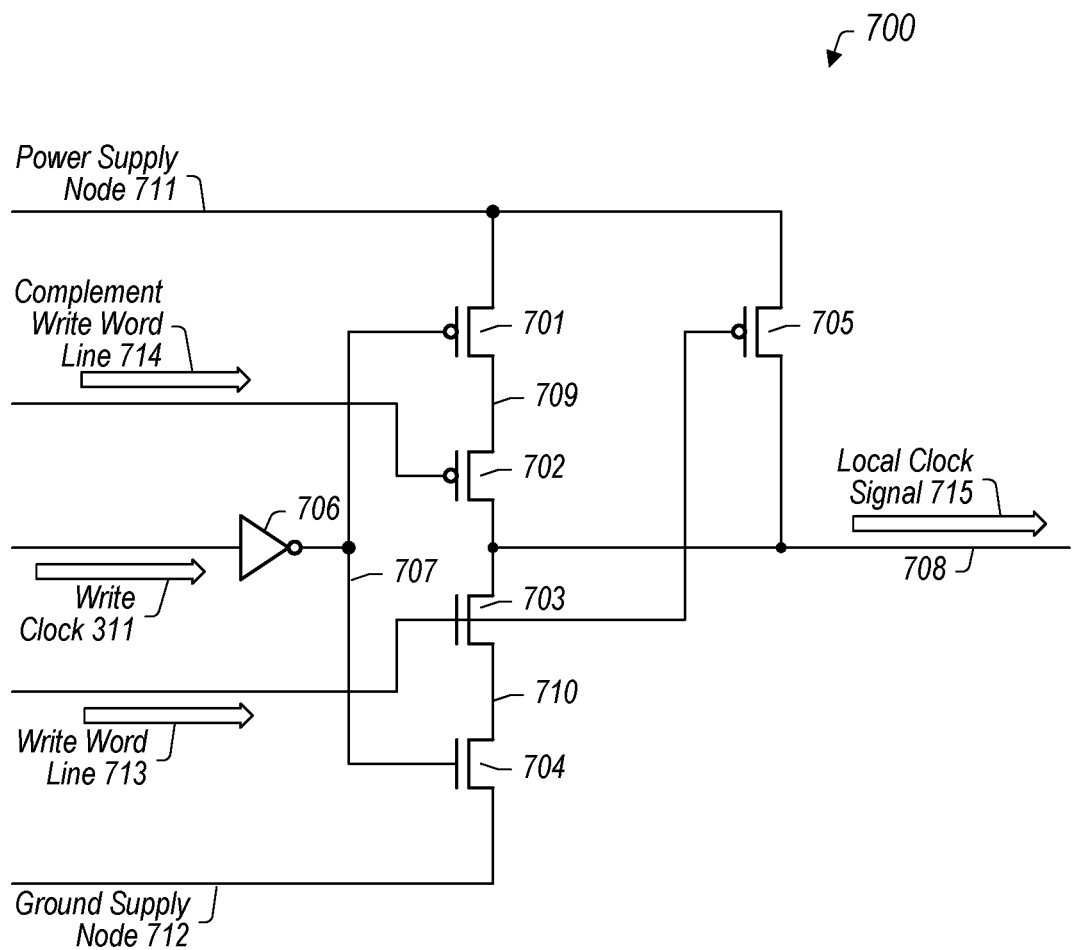
FIG. 7 is a block diagram illustrating an embodiment of a clock gate circuit.

Turning to FIG. 7, a block diagram of an embodiment of clock gate circuit 700 is depicted. As illustrated, clock gate circuit 700 includes inverter 706 and transistors 701-705. It is noted that clock gate circuit 700 may correspond to any of clock gate circuits 602A-602C as depicted in FIG. 6.

Transistor 701 is coupled between power supply node 711 and node 709, and is controlled by a voltage level of node 707. Transistor 702 is coupled between node 709 and node 708, and is controlled by complement write word line 714. Transistor 703 is coupled between node 708 and node 710, and is controlled by write word line 713. Transistor 704 is coupled between node 710 and ground supply node 712, and is controlled by the voltage level of node 707. Transistor 705 is coupled between power supply node 711 and node 708, and is controlled by write word line 713. It is noted that write word line 713 may correspond to any of write word lines 112A-112C, and that complement write word line 714 is a complement of write word line 713.

In various embodiments, transistors 701, 702, and 705 may be implemented as p-channel metal-oxide semiconductor field-effect transistors (MOSFETs), fin field-effect transistors (FinFETs), gate-all-around field-effect transistors (GAAFETs), or any other suitable transconductance devices. Additionally, transistors 703 and 704 may be implemented as n-channel MOSFETs, FinFETS, GAAFETS, or any other suitable transconductance devices. It is noted that although transistors 701-705 are depicted as being single transistors, in some embodiments, any of transistors 701-705 may be implemented using multiple transistors coupled together in parallel.

Inverter 706 is configured to generate a voltage level on node 707 that corresponds to a logic level that is an inverse of the logic level of write clock 311. In various embodiments, inverter 706 may be implemented as a CMOS inverter or any other suitable inverting amplifier circuit including those implemented with technologies other than CMOS.

Clock gate circuit 700 is in a deactivated state when write clock 316 is a logical-0, write word line 713 is a logical-0, and complement write word line 714 is a logical-1. Inverter 706 generates a logical-1 on node 707 in response to write clock 311 being a logical-0, which deactivates transistor 701 and activates transistor 704, coupling node 710 to ground supply node 712. The logical-0 value of write word line 713 deactivates transistor 703 and activates transistor 705, which couples node 708 to power supply node 711 resulting in local clock signal 715 being set to a logical-1.

In response to an activation of write clock 311, i.e., a transition of write clock 311 from a logical-0 to a logical-1, inverter 706 transitions node 707 from a logical-1 value to a logical-0. In response to the transition of node 707 to a logical-0, transistor 701 is activated, coupling node 708 to power supply node 711 when complement word line is a logical-0. Additionally, transistor 704 is deactivated in response to the transition of node 707 to a logical-0, decoupling node 710 from ground supply node 712.

In response to write word line 713 transitioning to logical-1 and complement write word line 714 transitioning to a logical-0, transistor 705 is deactivated, and transistors 702 and 703 are activated. With both transistors 701 and 702 activated, node 708 remains coupled to power supply node 711 via transistors 701 and 702 when write clock 311 is a logical-1.

At some point in time, write clock 311 will transition back to a logical-0, but write word line 713 and complement write word line 714 will remain at a logical-1 and a logical-0, respectively, due to write word line 713 and complement word line 714 being generated using extended write clock 312. The transition of write clock 311 to a logical-0 results in a logical-1 on node 707, deactivating transistor 701 and activating transistor 704. With both transistors 703 and 704 activated, node 708 is discharged to ground via transistors 703 and 704, resulting in local clock signal 715 transitioning to a logical-0. Local clock signal 715 will remain a logical-0 until write word line 713 and complement write word line 714 are deactivated, which is governed by an amount of delay generated by delay circuit 502 as shown in FIG. 5. With the deactivation of write word line 713 and complement write word line 714, clock gate circuit 700 transitions to an inactive state.

Figure 8:
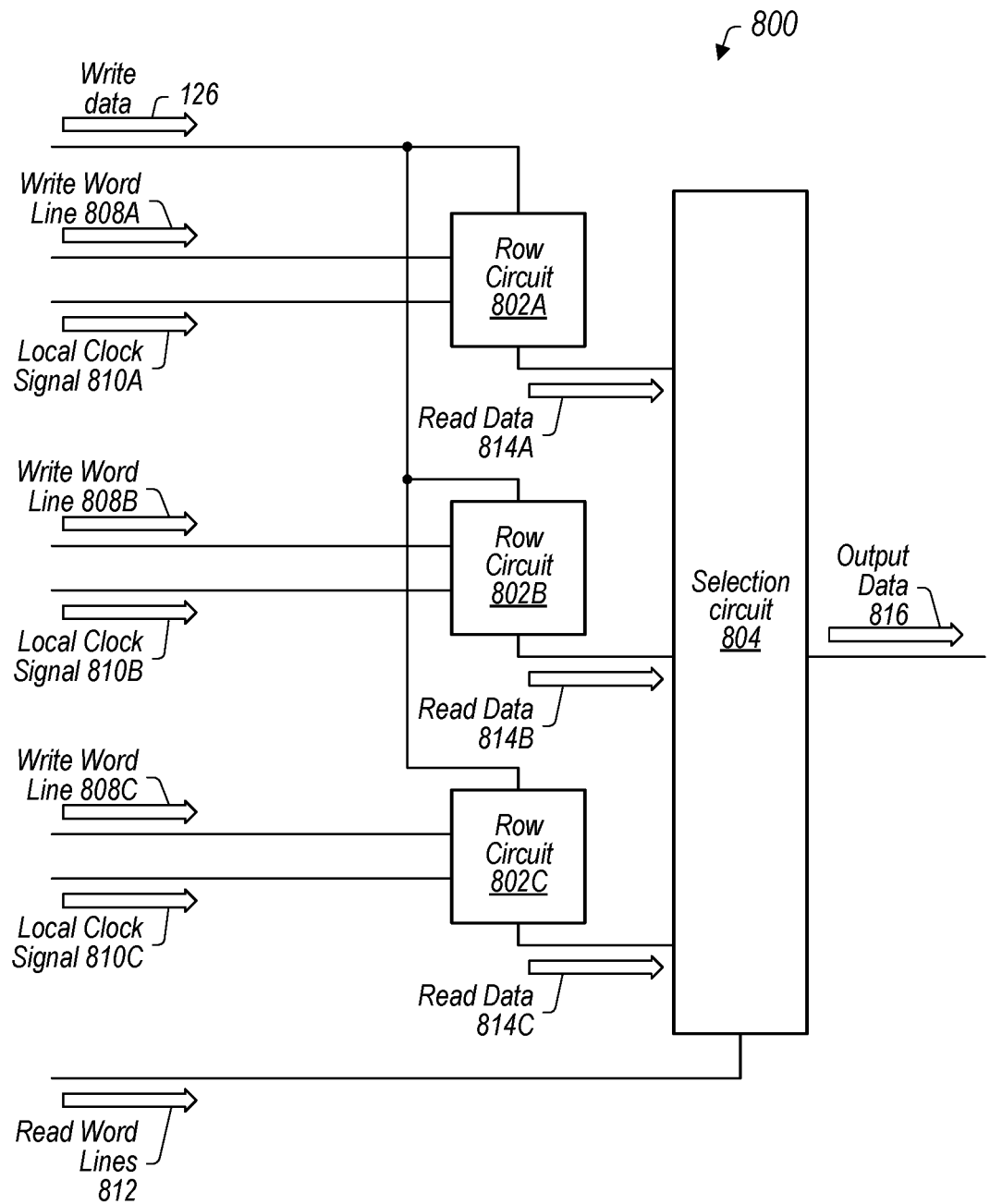
FIG. 8 is a block diagram illustrating an embodiment of a storage array circuit.

A block diagram of a storage array circuit is depicted in FIG. 8. Depending on the type of storage circuit employed, storage array circuit 800 may correspond to either of storage array circuit 102 or storage array circuit 202 as depicted in FIGS. 1 and 2, respectively. As illustrated, storage array circuit 800 includes row circuits 802A-802C and selection circuit 804. It is noted that although only three row circuits are depicted in the embodiment of FIG. 8, in other embodiments, any suitable number of row circuits may be employed.

Row circuit 802A is configured to store write data 126 based on write word line 808A and local clock signal 810A, and row circuit 802B is configured to store write data 126 based on write word line 808B and local clock signal 810B.

In a similar fashion, row circuit 802C is configured to store write data 126 based on write word line 808C and local clock signal 810C.

Row circuit 802A is configured to generate read data 814A, and row circuit 802B is configured to generate read data 814B. In a similar fashion, row circuit 802C is configured to generate read data 814C. In various embodiments, a given row circuit of row circuits 802A-802C is configured to update its corresponding read data after a write operation has been performed to the given circuit.

Selection circuit 804 is configured to select, based on read word lines 812, a particular one of read data 814A-814C to generate output data 816. In various embodiments, selection circuit 804 may be further configured to select the particular one of read data 814A-814C in response to an activation of a corresponding one of read word lines 812.

In various embodiments, selection circuit 804 may be implemented as a multiplex circuit. For example, selection circuit 804 may be implemented using multiple pass-gate circuits coupled together in a wired-OR fashion, or any other suitable arrangement of combinatorial logic gates.

Figure 9:
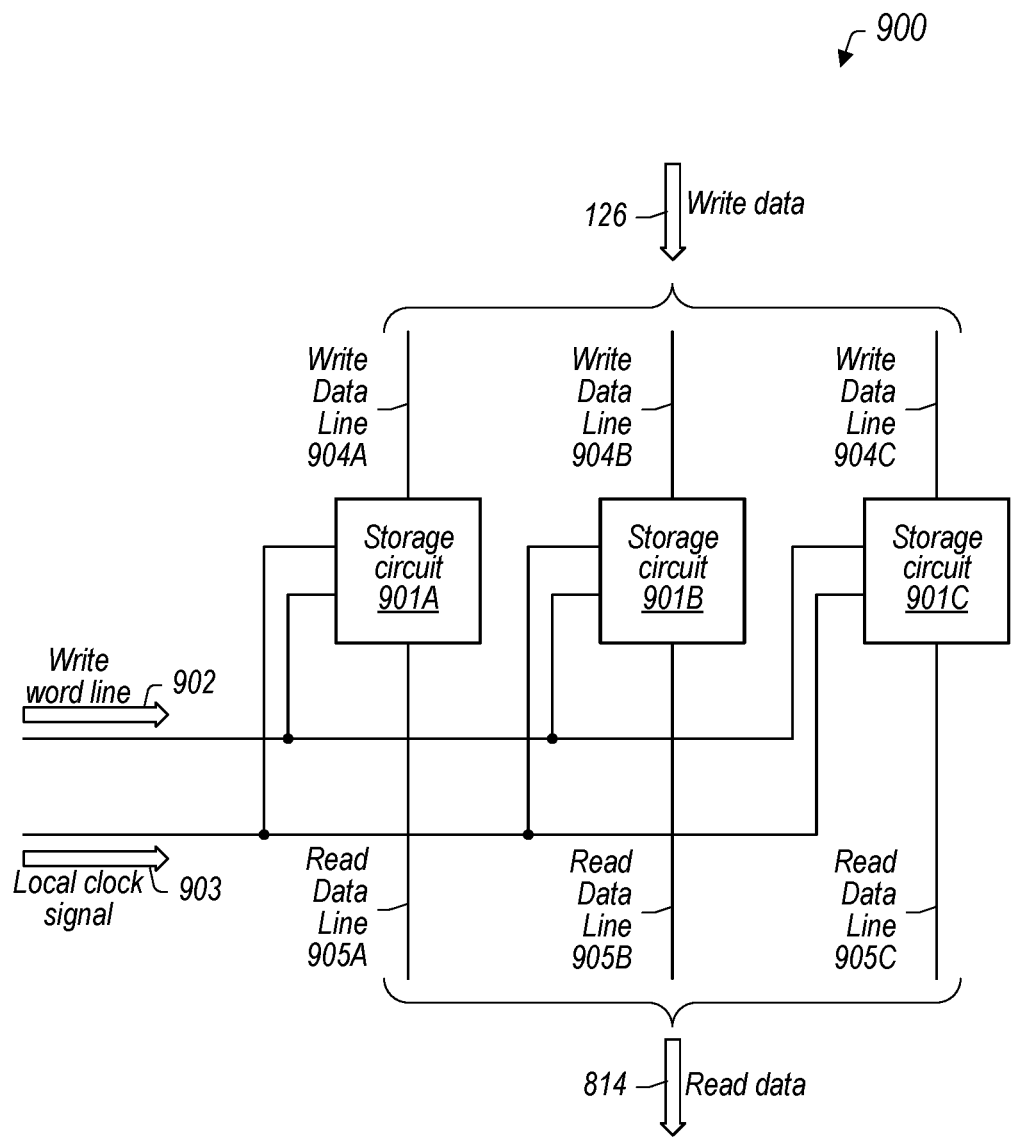
FIG. 9 is a block diagram illustrating an embodiment of a row of storage circuits used in a storage array circuit.

Turning to FIG. 9, a block diagram of a row circuit of a storage array circuit is depicted. As illustrated, row circuit 900 includes storage circuits 901A-901C. In various embodiments, row circuit 900 may correspond to any of rows 106A-106C, rows 206A-206C, or row circuits 802A-802C. It is noted that although only three storage circuits are depicted in row circuit 900, in other embodiments, any suitable number of storage circuits may be employed.

Storage circuit 901A is coupled to write data line 904A and read data line 905A, and storage circuit 901B is coupled to write data line 904B and read data line 905B. In a similar fashion, storage circuit 901C is coupled to write data line 904C and read data line 905C. Each of storage circuits 901A-901C are coupled to write word line 902 and local clock signal 903. In various embodiments, write word line 902 may correspond to any of write word lines 808A-C, and local clock signal 903 may correspond to any of local clock signals 810A-C as depicted in FIG. 8. It is noted that although write word line 902 and local clock signal 903 are depicted as single wires, in some embodiments, write word line 902 and local clock signal 903 may include multiple wires allowing for true and complement versions of the signals to be transmitted to storage circuits 901A-901C.

Different ones of write data lines 904A-904C may be coupled to corresponding bits of write data 126. For example, write data line 904A may be coupled to bit-0 of write data 126. In a similar fashion, different ones of read lines 905A-905C may contain corresponding bits of read data 814. For example, read data line 905A may contain bit-0 of read data 814.

As noted above, storage circuits 901A-901C may include corresponding first-stage circuits and second-stage circuits. The first-stage circuits are configured to store data on corresponding ones of write data lines 904A-904C in response to an activation of write word line 902. Storage circuits 901A-901C are configured to transfer data stored in the first-stage circuits to the second stage circuits in response to a de-activation of write word line 902.

In cases where the first-stage circuits are coupled to corresponding power gate circuits (as described below in FIG. 11), the power gate circuits are configured to couple the first-stage circuits to a power supply node, and the first-stage circuits are configured to store data on corresponding ones of write data lines 904A-904C in response to the activation of write word line 902. In cases where where the first-stage circuits are coupled to corresponding power gate circuits, storage circuits 901A-901C are configured to transfer data stored in the first-stage circuits to the second-stage circuits in response to activation of local clock signal 903.

Figure 10:
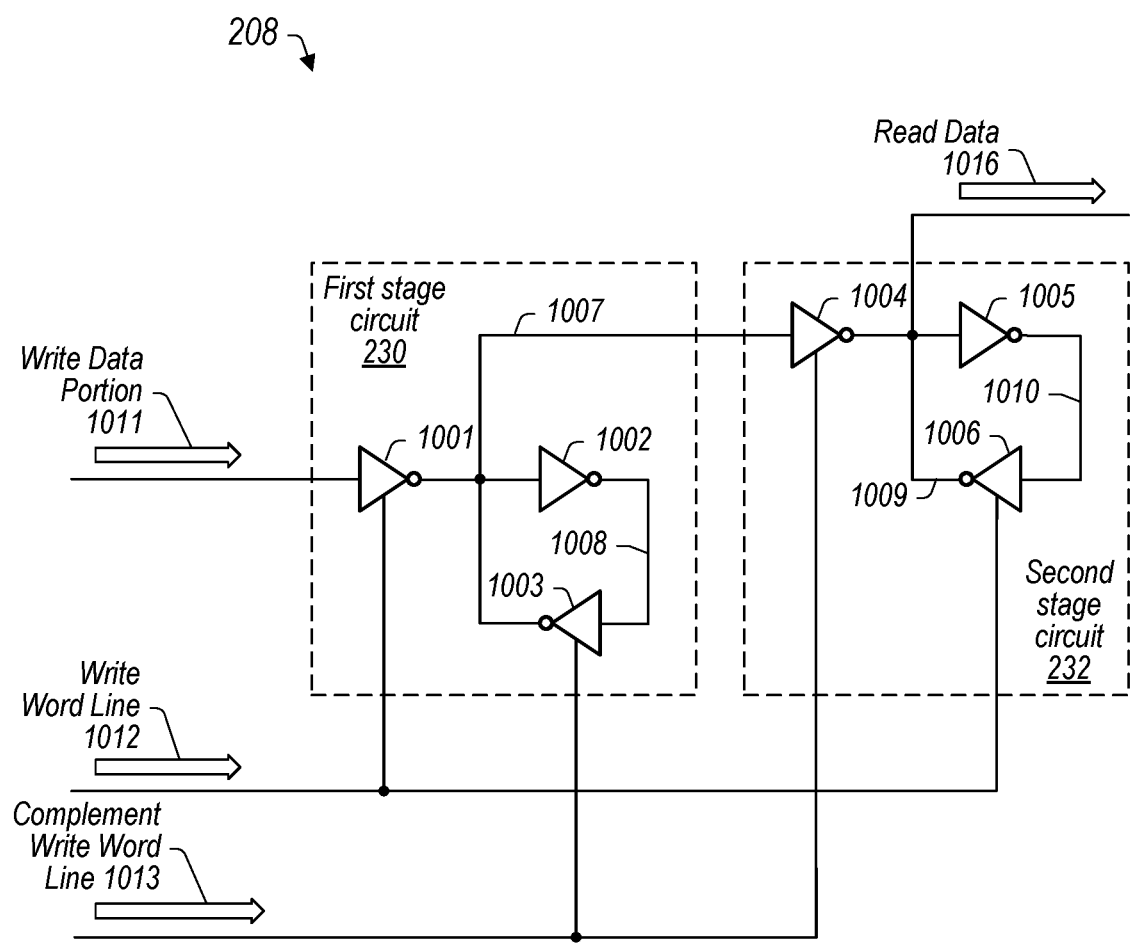
FIG. 10 is a block diagram illustrating an embodiment of a storage circuit for use in a storage array circuit.

Turning to FIG. 10, a block diagram of an embodiment of storage circuit 208 is depicted. As illustrated, storage circuit 208 includes first-stage circuit 230 and second stage circuit 232.

First-stage circuit 230 includes clocked inverters 1001 and 1003, and inverter 1002. Clocked inverter 1001 is configured to generate a complement of the logic level of write data portion 1011 on node 1007 when write word line 1012 is a logical-1. Inverter 1002 is configured to generate a complement of the logic level of node 1007 on node 1008. Clocked inverter 1003 is configured to generate a complement of the logic level of node 1008 on node 1007 when complement write word line 1013 is at logical-1.

When write word line 1012 is a logical-0 and complement write word line 1013 is a logical-1, clocked inverter 1001 is inactive, and clocked inverter 1003 is active. Inverter 1002 and clocked inverter 1003 form a feedback loop which stores a bit on the voltages of nodes 1007 and 1008. When write word line 1012 is a logical-1 and complement write word line 1013 is a logical-0, clocked inverter 1001 is active and clocked inverter 1003 is inactive. With clocked inverter 1003 inactive, the feedback loop is broken, and clocked inverter 1001 can set the voltage level of node 1007 to a voltage level corresponding to a complement of write data portion 1011, thereby storing new data in first-stage circuit 230. After the new data has been stored in first-stage circuit 230, write word line 1012 can be set to a logical-0 and complement word line 1013 can be set to a logical-1, allowing the feedback loop to become active again, so the new data is maintained in first-stage circuit 230.

In various embodiments, write data portion 1011 may correspond to a single bit of write data 226, and write word line 1012 may correspond to any of write word lines 212A-212C. Complement write word line 1013 may, in various embodiments, be a complement of write word line 1012.

Second stage circuit 232 includes clocked inverters 1004 and 1006, and inverter 1005. Clocked inverter 1004 is configured to generate a complement of the logic level of node 1007 on node 1009 when complement write word line 1013 is a logical-1. Inverter 1005 is configured to generate a complement of the logic level of node 1009 on node 1010. Clocked inverter 1006 is configured to generate a complement of the logic level of node 1010 on node 1009 when write word line 1012 is at logical-1.

When write word line 1012 is a logical-1 and complement write word line 1013 is a logical-0, clocked inverter 1004 is inactive, and clocked inverter 1006 is active. Inverter 1005 and clocked inverter 1006 form a feedback loop which stores a bit on the voltages of nodes 1009 and 1010. In various embodiments, read data 1016 corresponds to a voltage of node 1009 and may correspond to a bit of output data 816.

When write word line 1012 is a logical-0 and complement write word line 1013 is a logical-1, clocked inverter 1004 is active and clocked inverter 1006 is inactive. With clocked inverter 1006 inactive, the feedback loop is broken, and clocked inverter 1004 can set the voltage level of node 1009 to a voltage level corresponding to a complement of data stored on 1007, thereby transferring data previously stored in first-stage circuit 230 to second-stage circuit 232. After the new data has been stored in second-stage circuit 232, write word line 1012 can be set to a logical-1 and complement word line 1013 can be set to a logical-0, allowing the feedback loop to become active again, so the transferred data is maintained in second-stage circuit 232.

Inverters 1002 and 1005 may be implemented using any suitable inverting amplifier circuit including amplifier circuits implemented with technologies other than CMOS. Clocked inverters 1001, 1003, 1004, and 1006 may be implemented using a standard inverter circuit with header and/or footer transistors to decouple the clocked inverters from power and ground supply nodes when the corresponding enable signals are inactive.

Figure 11:
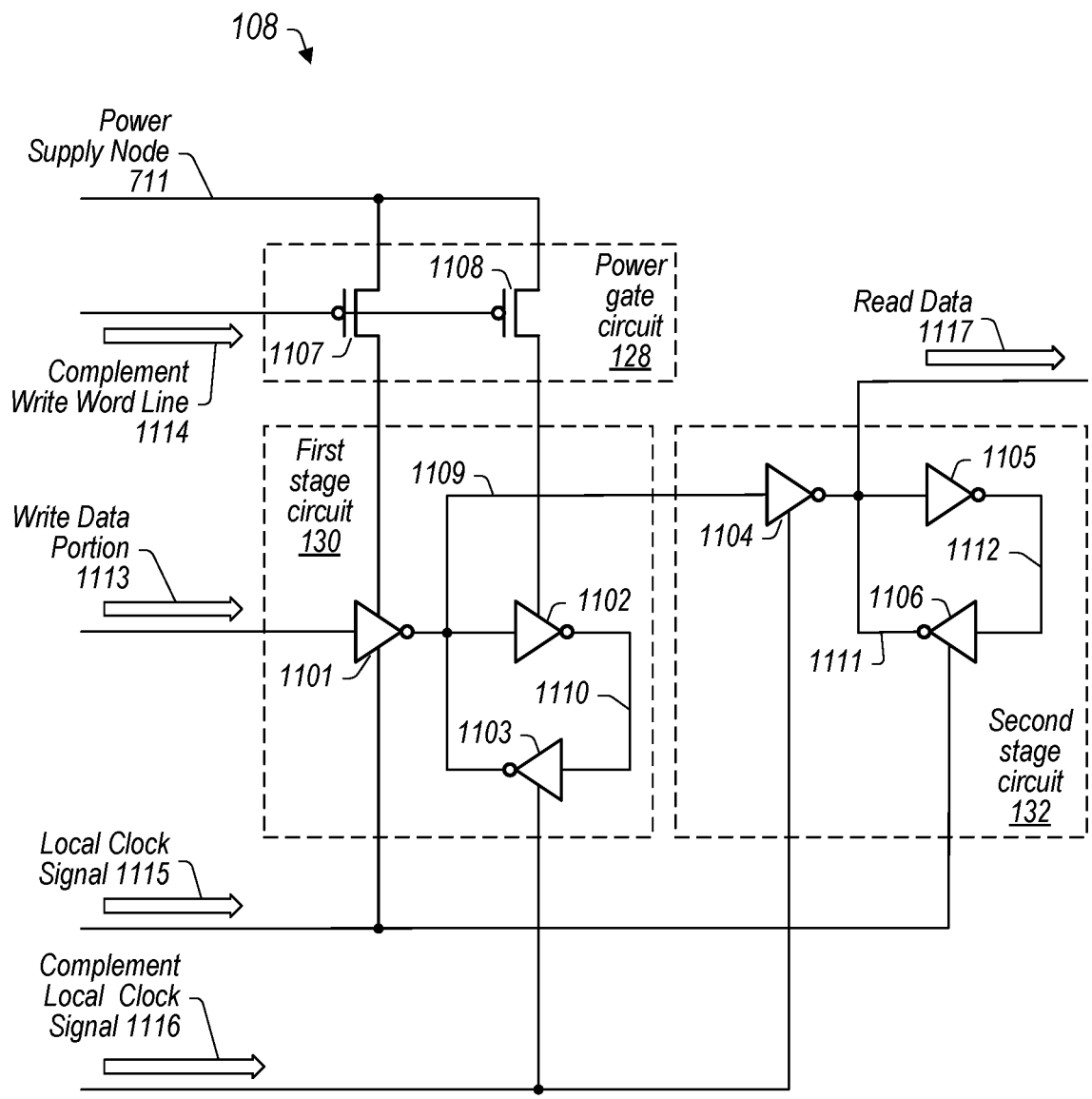
FIG. 11 is a block diagram illustrating a different embodiment of a storage circuit for use in a storage array circuit.

Turning to FIG. 11, a block diagram of an embodiment of storage circuit 108 is depicted. As illustrated, storage circuit 108 includes first-stage circuit 130, second-stage circuit 132, and power gate circuit 128.

Power gate circuit 128 includes transistors 1107 and 1108. Transistor 1107 is coupled between power supply node 711 and clocked inverter 1101, while transistor 1108 is coupled between power supply node 711 and inverter 1102. Both transistors 1107 and 1108 are controlled by complement write word line 1114. In response to complement write word line 1114 being set to a logical-0, transistors 1107 and 1008 are configured to couple power gated inverter 1101 and power gated inverter 1102, respectively, to power supply node 711. When complement write word line 1114 is a logical-1, transistors 1107 and 1108 are inactive, and clocked inverter 1101 and inverter 1102 are not coupled to power supply node 140, reducing power consumption of first-stage circuit 130. In various embodiments, complement write word line 1114 may be a complement of any of write words line 112A-112C.

In various embodiments, transistors 1107 and 1108 may be implemented as p-channel MOSFETs, FinFETs, GAAFETs, or any other suitable transconductance devices. Although transistors 1107 and 1108 are depicted as single transistors, in other embodiments, transistors 1107 and 1108 may be implemented using multiple transistors coupled together in parallel.

First-stage circuit 130 includes power-gated inverters 1101 and 1102, and clocked inverter 1103. Power-gated inverter 1001 is configured to generate a complement of the logic level of write data portion 1113 on node 1109 when complement write word line 1114 is a logical-0 and local clock signal 1115 is a logical-1. Power-gated inverter 1102 is configured to generate a complement of the logic level of node 1109 on node 1110 when complement write word line 1114 is a logical-0. Clocked inverter 1103 is configured to generate a complement of the logic level of node 1110 on node 1109 when complement local clock signal 1116 is a logical-1. In various embodiments, local clock signal 1115 may be any of local clock signals 114A-114C, and complement local clock signal 1116 may be a complement of local clock signal 1115.

Second stage circuit 132 includes clocked inverters 1104 and 1106, and inverter 1105. Clocked inverter 1104 is configured to generate a complement of the logic level of node 1109 on node 1111 when complement local clock signal 1116 is a logical-1. Inverter 1105 is configured to generate a complement of the logic level of node 1111 on node 1112. Clocked inverter 1106 is configured to generate a complement of the logic level of node 1112 on node 1111 when local clock signal 1115 is a logical-1.

Prior to a write access to storage circuit 108, complement write word line 1114 is a logical-1, which de-activates transistors 1107 and 1108, decoupling power-gated inverters 1101 and 1102 from power supply node 140. By decoupling power-gated inverters 1101 and 1102 from power supply node 711, the power dissipation of first-stage circuit 130 can be reduced.

To perform a write access, complement write word line 1114 is set to a logical-0, activating transistors 1107 and 1108, thereby providing power to power-gated inverters 1101 and 1102. During this time, local clock signal 1115 is a logical-1 and complement local clock signal 1116 is a logical-0, which activates power-gated inverter 1101 and de-activates clocked inverter 1103. With clocked inverter 1103 de-activated, the feedback loop formed by clocked inverter 1103 and power-gated inverter 1102 is broken, allowing power-gated inverter 1101 to generate a voltage on node 1109 that corresponds to a complement of the logic value of write data portion 1113. In various embodiments, write data portion 1113 may correspond to a portion of write data 126.

At the start of the write access, local clock signal 1115 is a logical-1 and complement local clock signal 1116 is a logical-0, which results in clocked inverter 1104 being de-activated and clocked inverter 1106 being activated. Inverter 1105 and clocked inverter 1106 form a feedback loop maintaining a previously stored value using the respective voltage levels of nodes 1111 and 1112.

As the write access finishes, local clock signal 1115 is pulsed low and complement local clock signal 1116 is pulsed high. The duration of the pulse is determined by pulse extender circuit 303. During the pulses of local clock signal 1115 and complement local clock signal 1116, power-gated inverter 1101 is inactive, and clocked inverter 1103 is active, placing first-stage circuit 130 in an opaque mode where no further new data can be received, and the previously received data is maintained by a feedback loop formed by power-gated inverter 1102 and clocked inverter 1103.

Additionally, during the pulses of local clock signal 1115 and complement local clock signal 1116, clocked inverter 1104 is active and clocked inverter 1106 is inactive. With clocked inverter 1104 active, data stored in first-stage circuit 130 can be transferred to second-stage circuit 132 as clocked inverter 1104 drives a voltage onto node 1111 that corresponds to a complement of a logic value of node 1109.

At the conclusion of the pulses on local clock signal 1115 and complement local clock signal 1116, clocked inverter 1106 return to an active state, while clocked inverter 1104 returns to an inactive state, placing second-stage circuit 132 in an opaque state where the recently received data is stored. Once the pulses on local clock signal 1115 and complement local clock signal 1116 have ended, complement write word line 1114 returns to a logical-1, de-activating transistors 1107 and 1108, thereby placing first-stage circuit 130 in a reduced power state.

Inverter 1105 may be implemented using any suitable inverting amplifier circuit including amplifier circuits implemented with technologies other than CMOS. Clocked inverters 1103, 1104, and 1106 may be implemented using a standard inverter circuit with header and/or footer transistors to deactivate the clocked inverters when the corresponding enable signals are inactive. Power-gated inverters 1101 and 1102 may be implemented using a standard inverter circuit or a clocked inverter circuit where the power terminal is coupled to a power switch device, i.e., transistors 1107 and 1008, rather than a power supply node.

Figure 12:
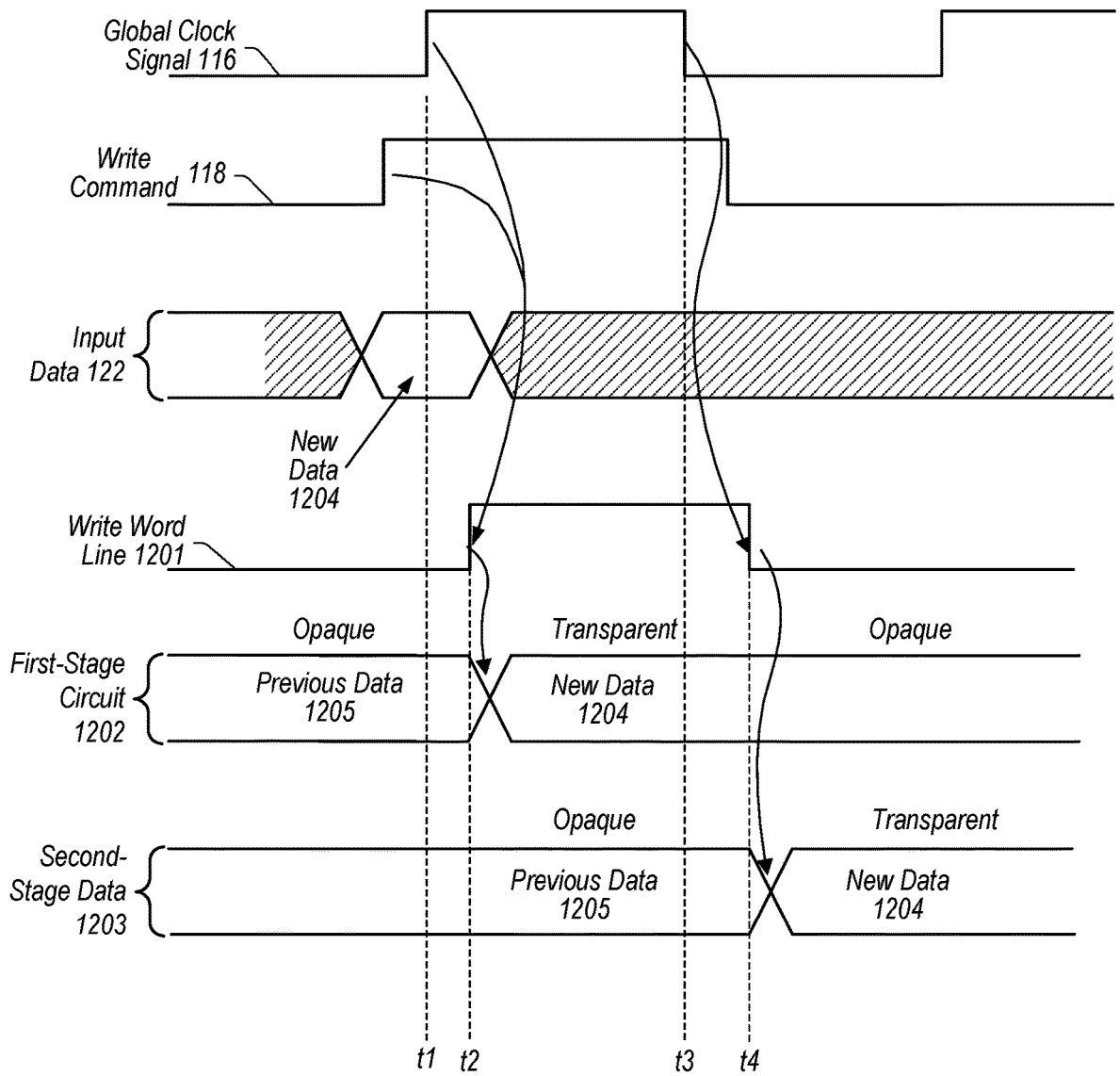
FIG. 12 illustrates example timing diagrams for operation of an embodiment of memory circuit 200.

Turning to FIG. 12, example waveforms associated with the operation of memory circuit 200 are illustrated. It is noted that the waveforms depicted in FIG. 12 are merely examples. In other embodiments, the depicted waveforms may have different relative timings to one another.

At time t1, global clock signal 116 transitions from a logical-0 to a logical-1. Prior to time t1, write command 118 and input data 122 are setup before the rising edge of global clock signal 116. On the rising edge of global clock signal 116, input data 122 is latched to generate new data 1204. In various embodiments, the amount of setup time may be based on a type of latch or flip-flop circuits used in register circuits 401 and 402.

In response to latching the logical-1 value of write command 118 at time t1, write word line 1201 is activated at time t2. In various embodiments, write word line 1201 may correspond to a particular one of write word lines 212A-212C.

In response to the activation of write word line 1201, first-stage circuit 1202 transitions from an opaque state to a transparent state. It is noted first-stage circuit 1202 may correspond to a first-stage circuit of any of storage circuits 208 in a selected one of rows 206A-206C in storage array circuit 202. As first-stage circuit 1202 transitions into transparent mode, new data 1204 overwrites previous data 1205.

At time t3, global clock signal 116 transitions back to a logical-0, which triggers a de-activation of write word line 1201. In response to the de-activation of write word line 1201, second-stage circuit 1203 transitions from opaque mode to transparent mode. It is noted that second-stage circuit 1203 may correspond to a second-stage circuit of any of storage circuits 208 in the selected one of rows 206A-206C in storage array circuit 202. As second-stage circuit 1203 transitions into transparent mode, new data 1204 overwrites previous data 1205 in second-stage circuit 1203. Once new data 1204 has been stored in second-stage circuit 1203, a new read or write cycle may begin on the next rising edge of global clock signal 116.

Although only a single write cycle is depicted in FIG. 12, in other embodiments, multiple write cycles may be performed in succession. In some embodiments, one or more read cycles may be interspersed between any two write cycles.

Figure 13:
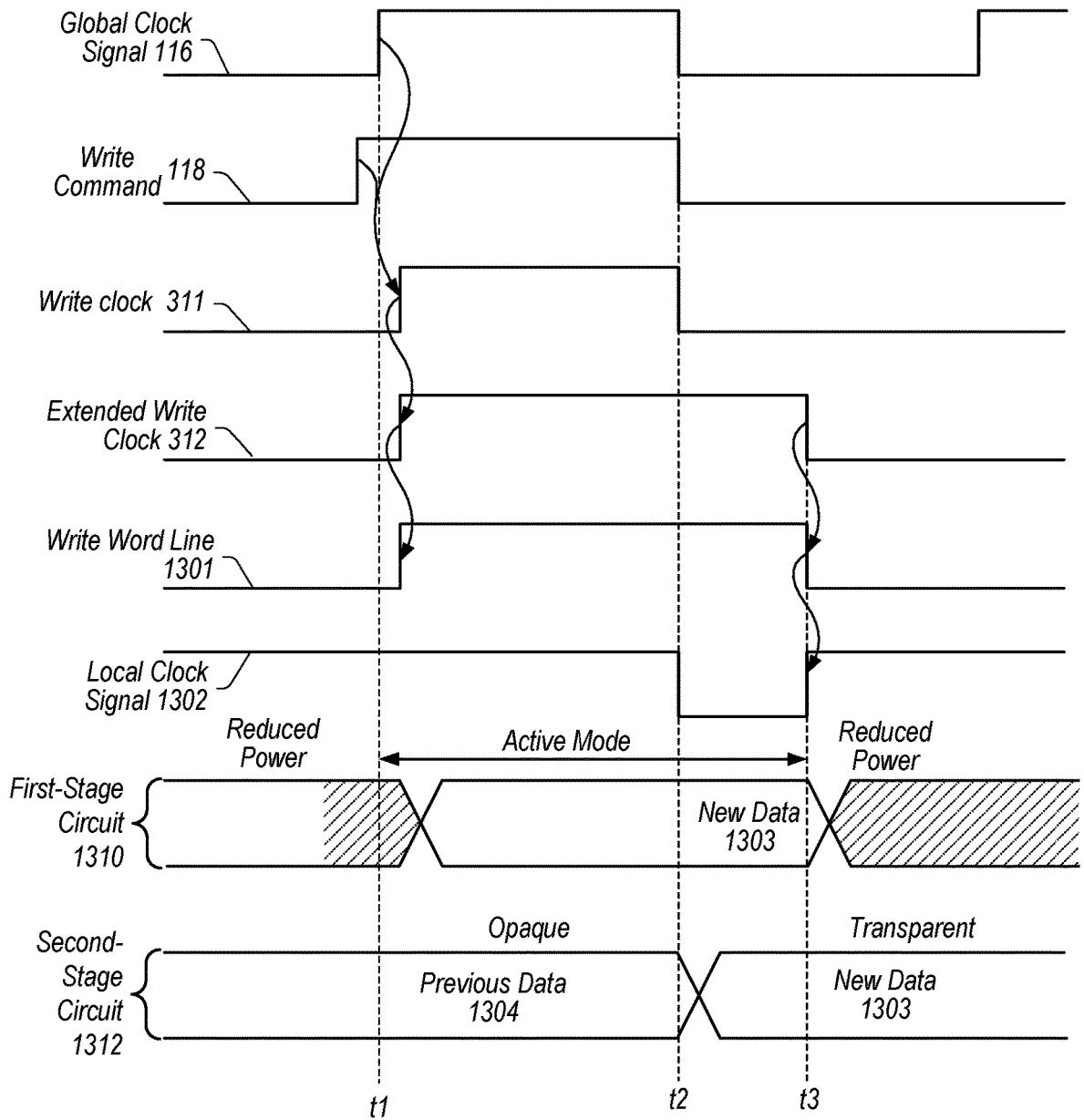
FIG. 13 illustrates example timing diagrams for operation of an embodiment of memory circuit 100.

Turning to FIG. 13, example waveforms associated with the operation of memory circuit 100 is illustrated. It is noted that the waveforms depicted in FIG. 13 are merely examples. In other embodiments, the depicted waveforms may have different relative timings to one another.

At time t1, global clock signal 116 transitions from a logical-0 to a logical-1. Prior to time t1, write command 118 is setup before the rising edge of global clock signal 116. On the rising edge of global clock signal 116, input data is latched to generate new data 1303.

In response to the rising edge of global clock signal 116 and latching the logical-1 state of write command 118, write clock 311 is activated, which, in turn, activates extended write clock 312. In response to the activation of extended write clock 312, write word line 1301 is activated. In various embodiments, write word line 1301 may correspond to a particular one of write word lines 112A-112C.

With the activation of write word line 1301, first-stage circuit 1310 exits a reduced power state and enters an active mode. While in the active mode, first-stage circuit 1310 is able to receive new data 1303. It is noted that first-stage circuit 1303 may correspond to a first-stage circuit of any of storage circuits 108 in a selected one of rows 106A-106C in storage array circuit 102.

At time t2, global clock signal 116 transitions back to a logical-0. In response to the falling-edge transition of global clock signal 116, write clock 311 transitions to a logical-0. Extended write clock 312, however, remains at a logical-1 for the duration determined by pulse extender circuit 303.

In response to the falling-edge transition of write clock 311, a low-going pulse is generated on local clock signal 1302. In various embodiments, local clock signal 1302 will remain at a logical-0 until extended write clock 312 returns to a logical-0 at time t3. It is noted that local clock signal 1302 may correspond to a particular one of local clock signals 114A-114C that corresponds to a selected one of write word lines 112A-112C.

In response to the pulse on local clock signal 1302, second-stage circuit 1312 transitions from an opaque state to a transparent state, allowing previous data 1304 to be overwritten by new data 1303. When the low-going pulse on local clock signal 1302 ends at time t3, second-stage circuit 1312 returns to opaque mode, storing new data 1303. Once extended write clock 312 has returned to a logical-0 and local clock signal 1302 has returned to a logical-1, memory circuit 100 is ready to begin either a read cycle or another write cycle on the next rising edge of global clock signal 116.

Although only a single write cycle is depicted in FIG. 13, in other embodiments, multiple write cycles may be performed in succession. In some embodiments, one or more read cycles may be interspersed between any two write cycles.

To summarize, various embodiments of a memory circuit are disclosed. Broadly speaking, an apparatus is contemplated in which a storage array circuit includes a plurality of storage circuits, where subsets of the plurality of storage circuits may be configured to store data in response to activation of corresponding word lines of a plurality of word line. A control circuit may be configured to activate a particular word line of the plurality of word lines using a received write address and, in response to an activation of a write command and to a first transition of a global clock signal from a first logical value to a second logical value, activate a particular local clock signal of a plurality of local clock signals using the particular word line. Write data received with the write address may be provided to the plurality of storage circuits, where a particular storage circuit of the plurality of storage circuits that is coupled to the particular word line includes a first stage circuit, a second stage circuit, and a power gating circuit. The particular storage circuit may be configured to transfer a portion of the write data from the first stage circuit to the second stage circuit in response to an activation of the particular local clock signal. The power gating circuit may be configured to couple at least a portion of the first stage circuit to a power supply node in response to an activation of the particular word line, and de-couple the at least a portion of the first stage circuit from the power supply node in response to a de-activation of the particular word line.

Figure 14:
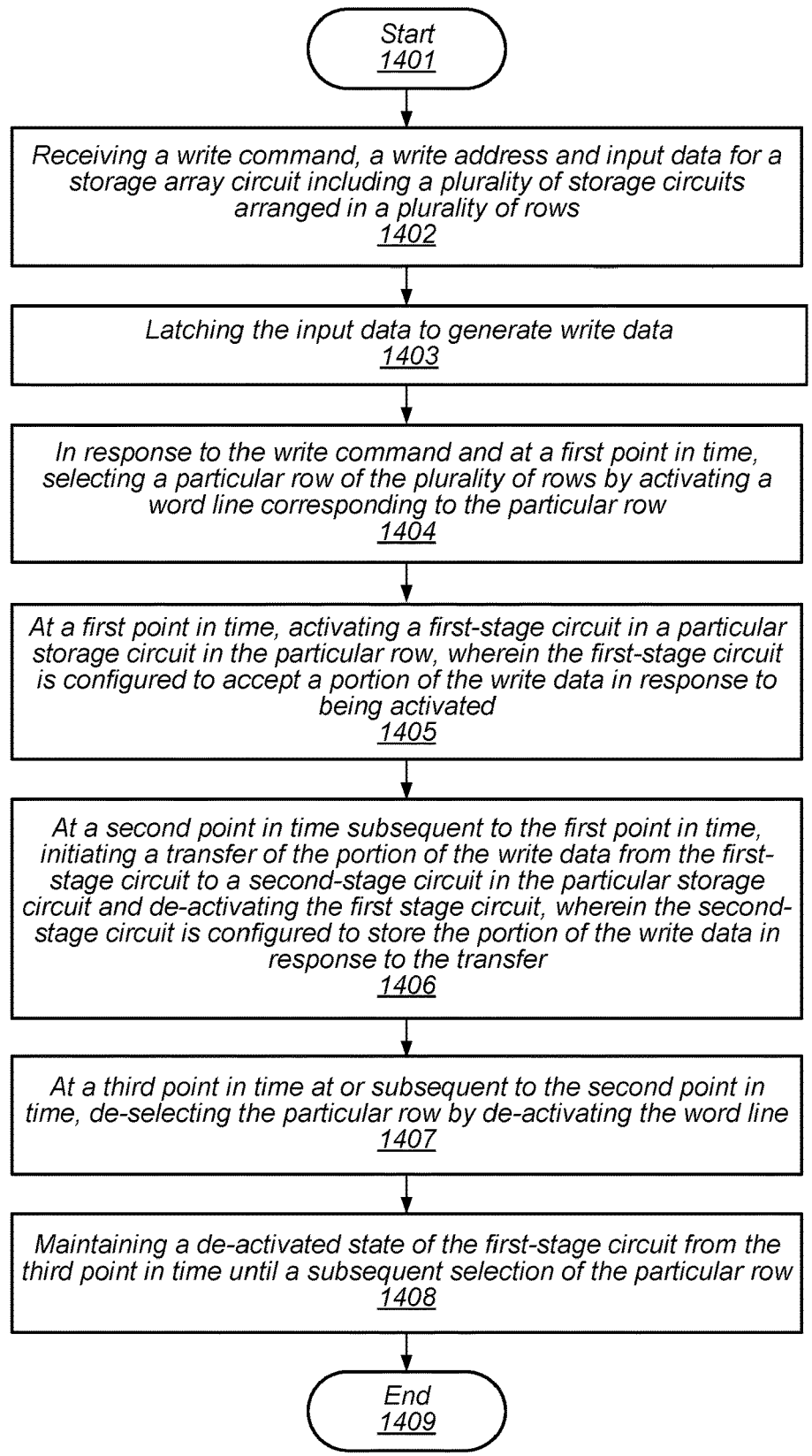
FIG. 14 is a flow diagram illustrating an embodiment of a method for operating a memory circuit.

Turning to FIG. 14, a flow diagram depicting an embodiment of a method for operating a memory circuit is illustrated. The method, which begins in block 1401, may be applied to various memory circuits including memory circuits 100 and 200 as depicted in FIGS. 1 and 2, respectively.

The method includes receiving a write command, a write address, and input data for a storage array circuit including a plurality of storage circuits arranged in a plurality of rows (block 1402). In various embodiments, a given row of the plurality of rows includes a subset of the plurality of storage circuits coupled to a common word line of a plurality of word lines.

The method further includes latching the input data to generate write data (block 1403). In some embodiments, latching the input data includes transitioning respective states of a plurality of latch circuits from a transparent state to an opaque state. In some embodiments, the input data includes a plurality of bits, and the plurality of latch circuits are configured to store corresponding bits of a plurality of bits included in the input data.

The method also includes, in response to the write command and at a first point in time, selecting a particular row of the plurality of rows by activating a word line corresponding to the particular row (block 1404). In various embodiments, activating the word line includes performing a decode operation on the write address, and activating the word line using a result of the decode operation.

The method further includes, at the first point in time, activating a first-stage circuit in a particular storage circuit in the particular row (block 1405). In various embodiments, the first-stage circuit is configured to accept a portion of the write data in response to being activated. In some embodiments, activating the first-stage circuit includes coupling a local supply node of the first-stage circuit to a power supply node.

The method also includes, at a second point in time subsequent to the first point in time, initiating a transfer of the portion of the write data from the first-stage circuit to a second-stage circuit in the particular storage circuit, and de-activating the first-stage circuit (block 1406). In various embodiments, the second-stage circuit is configured to store the portion of the write data in response to the transfer.

The method further includes, at a third point in time subsequent to the second point in time, de-selecting the particular row by de-activating the word line (block 1407). In some embodiments, the method further includes generating a write clock using the write command and a global clock signal, extending a duration of the write clock, and de-activating the word line using an extended version of the write clock.

The method also includes maintaining a de-activated state of the first-stage circuit from the third point in time until a subsequent selection of the particular row (block 1408). The method concludes in block 1409.

Figure 15:
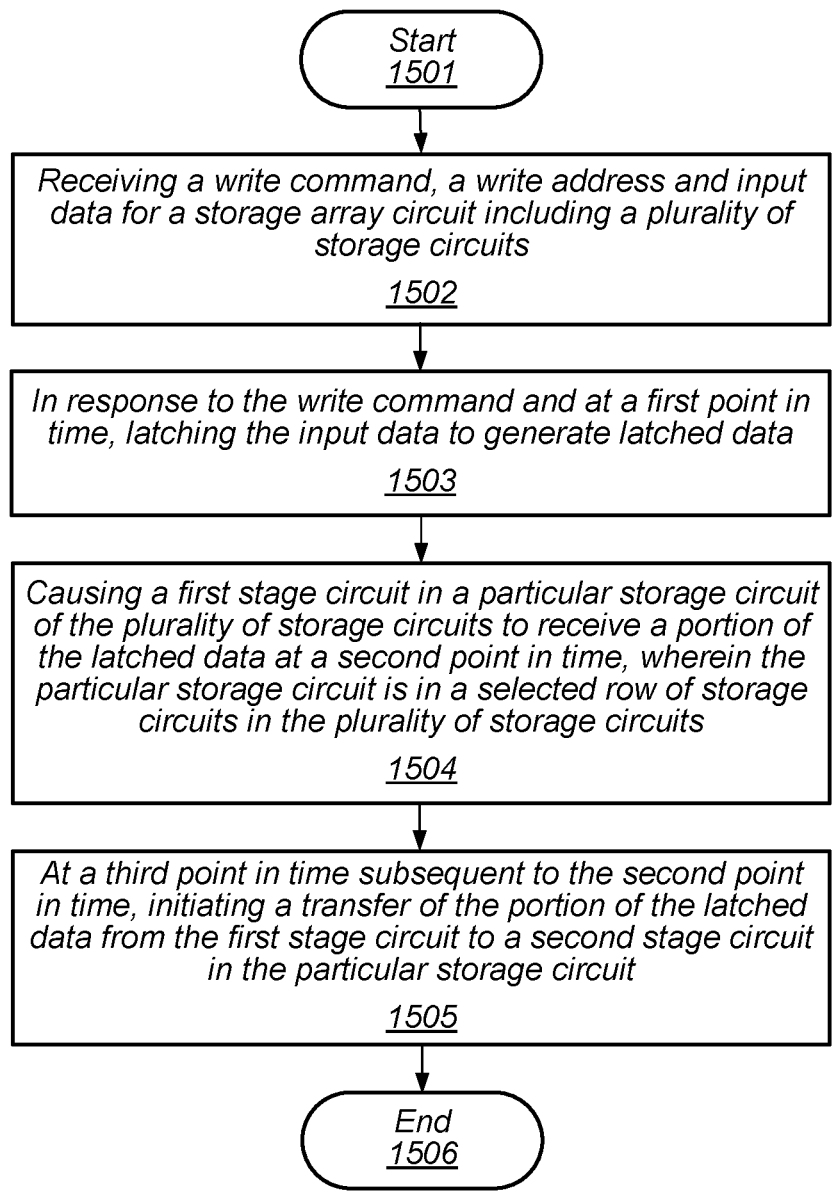
FIG. 15 is a flow diagram illustrating an embodiment of another method for operating a memory circuit.

Turning to FIG. 15, a flow diagram depicting an embodiment of another method for operating a memory circuit is illustrated. The method, which begins in block 1501, may be applied to various memory circuits including memory circuits 100 and 200 as depicted in FIGS. 1 and 2, respectively.

The method includes receiving a write command, a write address, and input data for a storage array circuit that includes a plurality of storage circuits (block 1502). In various embodiments, the plurality of storage circuits are arranged in a plurality of rows within the storage array circuit, where a given row of the plurality of rows includes a subset of the plurality of storage circuits coupled to a common selection signal.

The method further includes, in response to the write command and at a first point in time, latching the input data to generate latched data (block 1503). In some embodiments, latching the input data may include activating a plurality of latch circuits included in a register circuit.

The method also includes causing a first stage circuit in a particular storage circuit of the plurality of storage circuits to receive a portion of the latched data at a second point in time, wherein the particular storage circuit is in a selected row of storage circuits in the plurality of storage circuits (block 1504). In some cases, the method may further include performing a decode operation on the write address, and selecting a particular row of the plurality of rows using a result of the decode operation.

The method further includes, at a third point in time subsequent to the second point in time, initiating a transfer of the portion of the latched data from the first-stage circuit to a second-stage circuit in the particular storage circuit (block 1505). In various embodiments, initiating the transfer of the portion of the latched data includes changing a state of the second stage circuit from an opaque state to a transparent state. The method concludes in block 1506.

Figure 16:
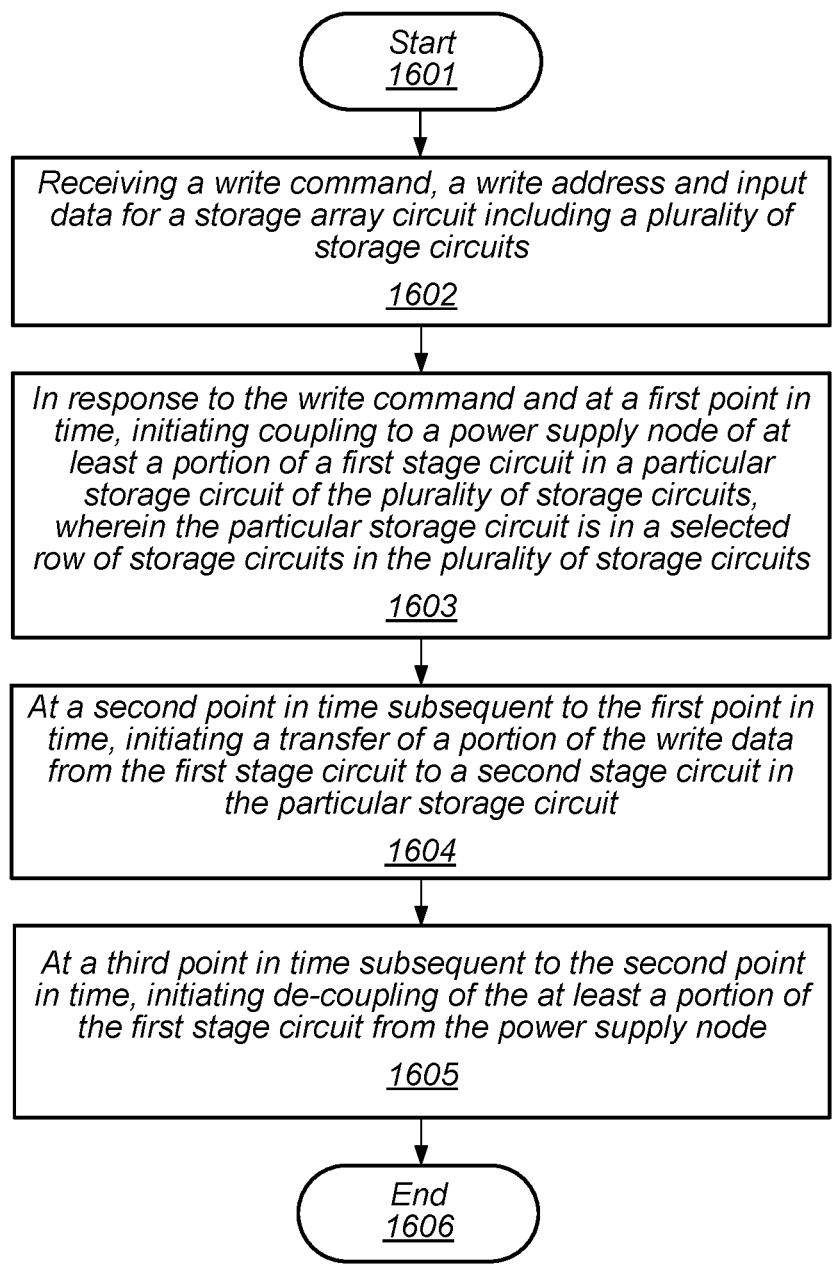
FIG. 16 is a flow diagram illustrating an embodiment of a different method for operating a memory circuit.

Turning to FIG. 16, a flow diagram depicting an embodiment of a different method for operating a memory circuit is illustrated. The method, which begins in block 1601, may be applied to various memory circuits, such as memory circuit 100 as depicted in FIG. 1.

The method includes receiving a write command, a write address, and input data for a storage array circuit that includes a plurality of storage circuits (block 1602). In various embodiments, the plurality of storage circuits are arranged in a plurality of rows within the storage array circuit, where a given row of the plurality of rows includes a subset of the plurality of storage circuits coupled to a common word line of a plurality of word lines.

The method further includes, in response to the write command and at least a first point in time, initiating coupling to a power supply node of at least a portion of a first-stage circuit in a particular storage circuit of the plurality of storage circuits (block 1603). In various embodiments, the particular storage circuit is in a selected row of storage circuits in the plurality of storage circuits. In some embodiments, coupling to the power supply node includes activating a transistor that is coupled between the power supply node and a local supply node included in the portion of the first-stage circuit. In other embodiments, initiating the coupling of the power supply node includes activating a particular word line of the plurality of word lines. In some embodiments, activating the particular word line includes activating the particular word line in response to a first transition of a global clock signal.

The method also includes, at a second point in time subsequent to the first point in time, initiating a transfer of a portion of the write data from the first stage circuit to a second-stage circuit in the particular storage circuit (block 1604). In various embodiments, initiating the transfer of the portion of the write data includes changing a state of the second-stage circuit from an opaque state to a transparent state. In other embodiments, initiating the transfer of the portion of the write data includes activating a particular local clock signal of a plurality of local clock signals using the particular word line.

In some embodiments, activating the particular local clock signal may include producing a falling transition of the particular local clock signal. Additionally, activating the particular local clock signal may include activating the particular local clock signal in response to a second transition of the global clock signal, where the second transition of the global clock signal is subsequent to the first transition of the global clock signal.

The method further includes, at a third point in time subsequent to the second point in time, initiating de-coupling of the at least the portion of the first-stage circuit from the power supply node (block 1605). In some embodiments, decoupling the portion of the first-stage circuit includes de-activating the transistor coupled between the power supply node and the local supply node included in the portion of the first-stage circuit. In other embodiments, initiating de-coupling from the power supply node includes de-activating the particular word line. In various embodiments, the method may also include delaying the de-activating of the particular word line with respect to the second transition of the global clock signal.

In some embodiments, the method further includes, in response to the write command and at a fourth point in time prior to the second point in time, capturing the write data using a register circuit. The method ends in block 1606.

It is noted that the operations depicted in the flow diagrams of FIGS. 14-16 can be used in combination. For example, one or more operations depicted in the flow diagram of FIG. 15 may be included in the flow diagram depicted in FIG. 14.

Figure 17:
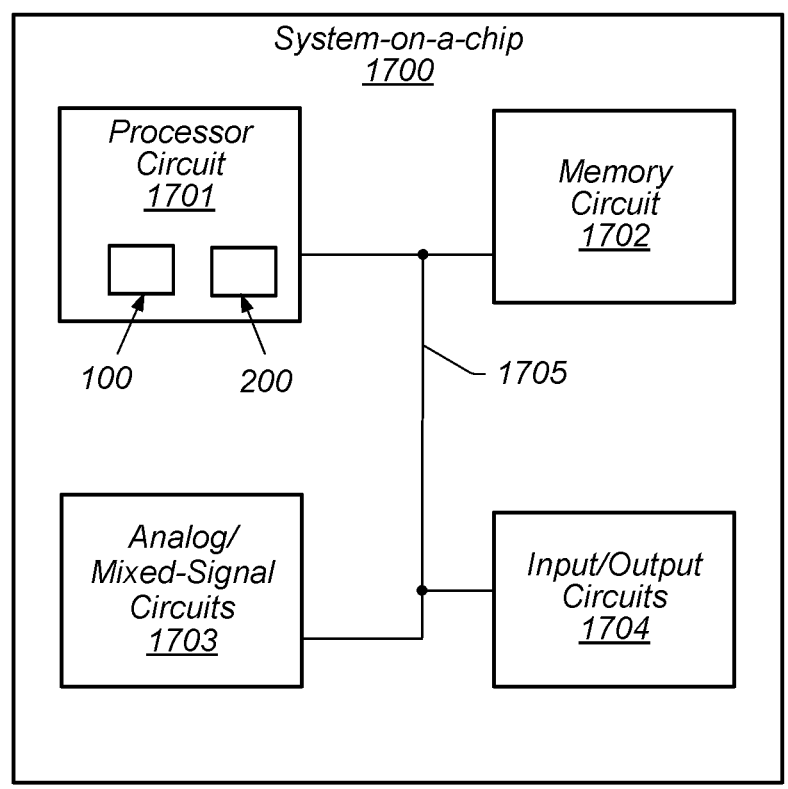
FIG. 17 is a block diagram of a system-on-a-chip including a data storage circuit.

A block diagram of a system-on-a-chip (SoC) is illustrated in FIG. 17. In the illustrated embodiment, SoC 1700 includes processor circuit 1701, memory circuit 1702, analog/mixed-signal circuits 1703, and input/output circuits 1704, each of which is coupled to communication bus 1705. In various embodiments, SoC 1700 may be configured for use in a desktop computer, server, or in a mobile computing application such as a tablet, laptop computer, or a wearable computing device.

Processor circuit 1701 may, in various embodiments, be representative of a general-purpose processor that performs computational operations. For example, processor circuit 1701 may be a central processing unit (CPU) such as a microprocessor, a microcontroller, an application-specific integrated circuit (ASIC), or a field-programmable gate array (FPGA). Processor circuit 1701 may include various buffers or other in-processor memories implemented using data storage circuits such as memory circuits 100 and 200 as depicted in FIGS. 1 and 2, respectively.

Memory circuit 1702 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 17, in other embodiments, any suitable number of memory circuits may be employed.

Analog/mixed-signal circuits 1703 may include a crystal oscillator circuit, a phase-locked loop circuit, an analog-to-digital converter (ADC) circuit, and a digital-to-analog converter (DAC) circuit (all not shown). In some embodiments, analog/mixed-signal circuits 1703 may be configured to perform power management tasks with the inclusion of on-chip power supplies and voltage regulator circuits.

Input/output circuits 1704 may be configured to coordinate data transfer between SoC 1700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1704 may be configured to implement a version of Universal Serial Bus (USB) protocol or IEEE 1394 (Firewire®) protocol.

Input/output circuits 1704 may also be configured to coordinate data transfer between SoC 1700 and one or more devices (e.g., other computing systems or integrated circuits) coupled to SoC 1700 via a network. In one embodiment, input/output circuits 1704 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1704 may be configured to implement multiple discrete network interface ports.

Figure 18:
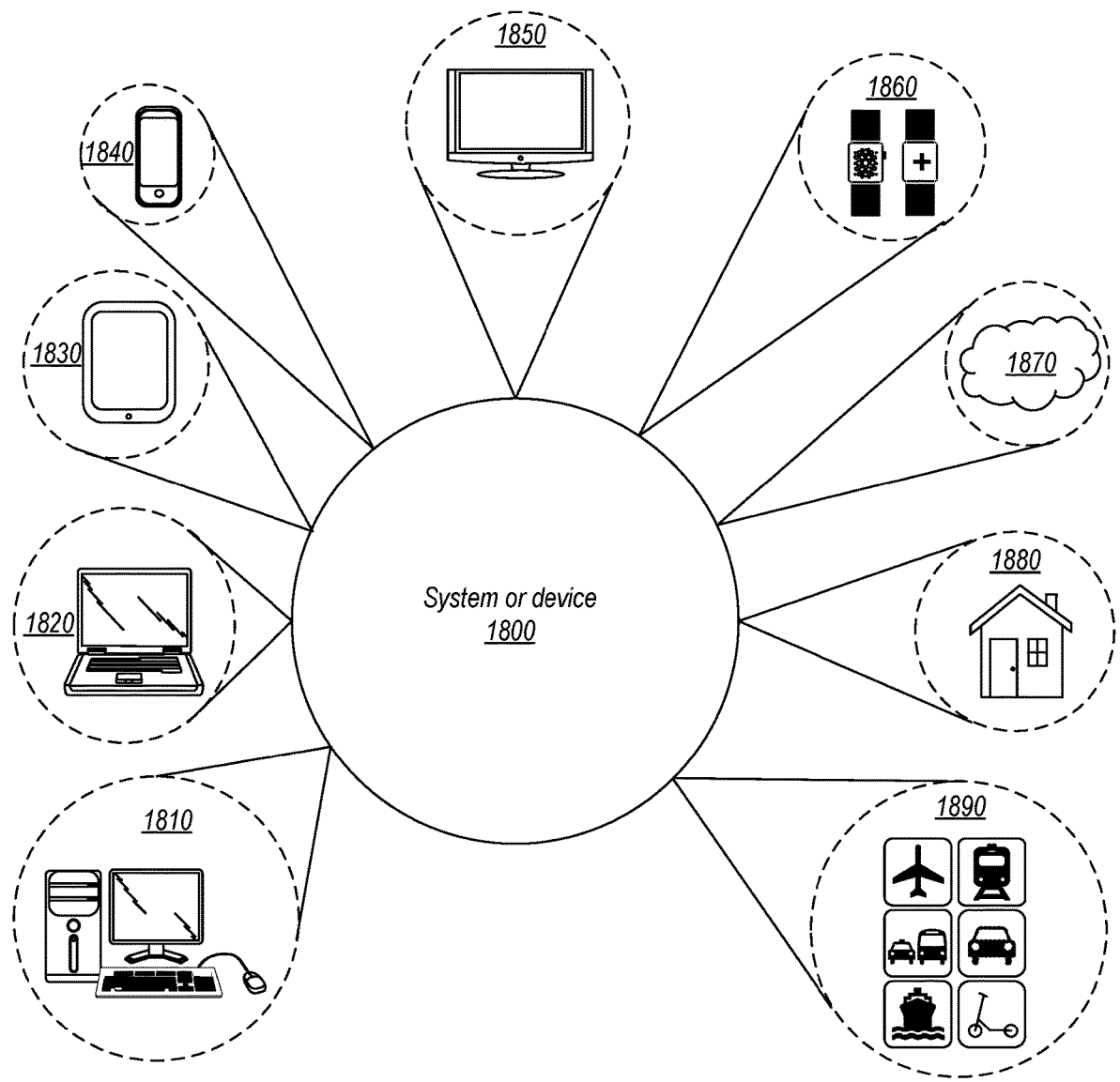
FIG. 18 is a block diagram of various embodiments of computer systems that may include memory circuits.

Turning now to FIG. 18, various types of systems that may include any of the circuits, devices, or systems discussed above are illustrated. System or device 1800, which may incorporate or otherwise utilize one or more of the techniques described herein, may be utilized in a wide range of areas. For example, system or device 1800 may be utilized as part of the hardware of systems such as a desktop computer 1810, laptop computer 1820, tablet computer 1830, cellular or mobile phone 1840, or television 1850 (or set-top box coupled to a television).

Similarly, disclosed elements may be utilized in a wearable device 1860, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1800 may also be used in various other contexts. For example, system or device 1800 may be utilized in the context of a server computer system, such as a dedicated server or on shared hardware that implements a cloud-based service 1870. Still further, system or device 1800 may be implemented in a wide range of specialized everyday devices, including devices 1880 commonly found in the home such as refrigerators, thermostats, security cameras, etc. The interconnection of such devices is often referred to as the "Internet of Things" (IoT). Elements may also be implemented in various modes of transportation. For example, system or device 1800 could be employed in the control systems, guidance systems, entertainment systems, etc. of various types of vehicles 1890.

The applications illustrated in FIG. 18 are merely exemplary and are not intended to limit the potential future applications of disclosed systems or devices. Other example applications include, without limitation: portable gaming devices, music players, data storage devices, unmanned aerial vehicles, etc.

Figure 19:
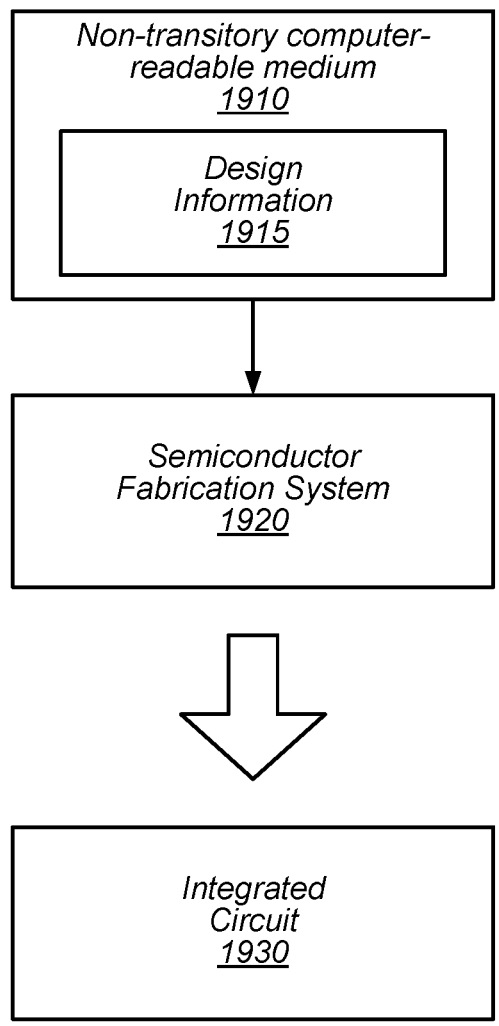
FIG. 19 illustrates an example of a non-transitory computer-readable storage medium that stores circuit design information.

FIG. 19 is a block diagram illustrating an example of a non-transitory computer-readable storage medium that stores circuit design information, according to some embodiments. In the illustrated embodiment, semiconductor fabrication system 1920 is configured to process design information 1915 stored on non-transitory computer-readable storage medium 1910 and fabricate integrated circuit 1930 based on design information 1915.

Non-transitory computer-readable storage medium 1910, may comprise any of various appropriate types of memory devices or storage devices. Non-transitory computer-readable storage medium 1910 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1910 may include other types of non-transitory memory as well or combinations thereof. Non-transitory computer-readable storage medium 1910 may include two or more memory mediums, which may reside in different locations, e.g., in different computer systems that are connected over a network.

Design information 1915 may be specified using any of various appropriate computer languages, including hardware description languages such as, without limitation: VHDL, Verilog, SystemC, SystemVerilog, RHDL, M, MyHDL, etc. Design information 1915 may be usable by semiconductor fabrication system 1920 to fabricate at least a portion of integrated circuit 1930. The format of design information 1915 may be recognized by at least one semiconductor fabrication system, such as semiconductor fabrication system 1920, for example. In some embodiments, design information 1915 may include a netlist that specifies elements of a cell library, as well as their connectivity. One or more cell libraries used during logic synthesis of circuits included in integrated circuit 1930 may also be included in design information 1915. Such cell libraries may include information indicative of device or transistor level netlists, mask design data, characterization data, and the like, of cells included in the cell library.

Integrated circuit 1930 may, in various embodiments, include one or more custom macrocells, such as memories, analog or mixed-signal circuits, and the like. In such cases, design information 1915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1920 may also be configured to perform various testing of fabricated circuits for correct operation.

In various embodiments, integrated circuit 1930 is configured to operate according to a circuit design specified by design information 1915, which may include performing any of the functionality described herein. For example, integrated circuit 1930 may include any of various elements shown or described herein. Further, integrated circuit 1930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a storage array circuit including a plurality of storage circuits, wherein subsets of the plurality of storage circuits are configured to store data in response to activation of corresponding word lines of a plurality of word lines; and
   a control circuit configured to:
      activate a particular word line of the plurality of word lines using a received write address and in response to an activation of a write command and to a first transition of a global clock signal from a first logical value to a second logical value; and
      activate a particular local clock signal of a plurality of local clock signals using the particular word line;
   wherein write data received with the write address is provided to the plurality of storage circuits, wherein a particular storage circuit of the plurality of storage circuits that is coupled to the particular word line includes a first stage circuit, a second stage circuit, and a power gating circuit, wherein the particular storage circuit is configured to transfer a portion of the write data from the first stage circuit to the second stage circuit in response to an activation of the particular local clock signal; and
   wherein the power gating circuit is configured to:
      couple at least a portion of the first stage circuit to a power supply node in response to an activation of the particular word line; and
      de-couple the at least a portion of the first stage circuit from the power supply node in response to a de-activation of the particular word line.

2. The apparatus of claim 1, wherein the control circuit is further configured to:
   activate the particular word line by causing a rising transition of the particular word line; and
   de-activate the particular word line by causing a falling transition of the particular word line.

3. The apparatus of claim 2, wherein the control circuit is further configured to:
cause a falling transition in the particular local clock signal in response to an activation of the particular local clock signal; and
activate the particular local clock signal in response to a second transition of the global clock signal from the second logical value to the first logical value, wherein the second transition of the global clock signal is subsequent to the first transition of the global clock signal.

4. The apparatus of claim 3, wherein a first voltage level corresponding to the first logical value is lower than a second voltage level corresponding to the second logical value.

5. The apparatus of claim 3, wherein the control circuit is further configured to:
delay the de-activation of the particular word line with respect to the second transition of the global clock signal; and
de-activate the particular local clock signal in response to the de-activation of the particular word line.

6. The apparatus of claim 1, wherein the control circuit is configured to activate the particular local clock signal subsequent to coupling the at least a portion of the first stage circuit to the power supply node.

7. The apparatus of claim 6, wherein the control circuit is configured to de-couple the at least a portion of the first stage circuit from the power supply node subsequent to activating the particular local clock signal.

8. An apparatus, comprising:
a storage array circuit including a plurality of storage circuits;
a control circuit configured, in response to an activation of a write command, to:
latch input write data, in response to a first transition of a global clock signal from a first logical value to a second logical value, to generate latched data; and
activate a particular word line of a plurality of word lines using a write address associated with the input write data; and
wherein a particular storage circuit of the plurality of storage circuits is configured to:
receive a portion of the latched data in a first stage circuit included in the particular storage circuit in response to activation of the particular word line; and
transfer the portion of the latched data from the first stage circuit to a second stage circuit included in the particular storage circuit in response to a de-activation of the particular word line.

9. The apparatus of claim 8, wherein:
the first stage circuit of the particular storage circuit is configured to be in an opaque state of not receiving new data when the particular word line is de-activated, and in a transparent state of receiving new data when the particular word line is activated; and
the second stage circuit of the particular storage circuit is configured to be in the transparent state when the particular word line is de-activated, and in the opaque state when the particular word line is activated.

10. The apparatus of claim 8, wherein:
the control circuit is further configured to activate a particular local clock signal of a plurality of local clock signals using the particular word line; and
the particular storage circuit is configured to receive the portion of the latched data into the first stage circuit in response to an activation of the particular local clock signal, and to transfer the portion of the latched data from the first stage circuit to the second stage circuit in response to a de-activation of the particular local clock signal.

11. The apparatus of claim 8, wherein the control circuit is further configured to de-activate the particular word line in response to a second transition of the global clock signal from the second logical value to the first logical value.

12. The apparatus of claim 8, wherein a first voltage level corresponding to the first logical value is lower than a second voltage level corresponding to the second logical value.

13. The apparatus of claim 11, wherein the control circuit is further configured to:
activate the particular word line by causing a rising transition of the particular word line;
de-activate the particular word line by causing a falling transition of the particular word line; and
wherein the particular storage circuit is further configured to transfer the portion of the latched data from the first stage circuit to the second stage circuit in response to the falling transition of the particular word line.

14. A method, comprising:
receiving a write command, a write address, and write data for a storage array circuit including a plurality of storage circuits;
in response to the write command and at a first point in time, initiating coupling to a power supply node of at least a portion of a first stage circuit in a particular storage circuit of the plurality of storage circuits, wherein the particular storage circuit is in a selected row of storage circuits in the plurality of storage circuits;
at a second point in time subsequent to the first point in time, initiating a transfer of a portion of the write data from the first stage circuit to a second stage circuit in the particular storage circuit; and
at a third point in time subsequent to the second point in time, initiating de-coupling of the at least a portion of the first stage circuit from the power supply node.

15. The method of claim 14, further comprising, in response to the write command and at a fourth point in time prior to the second point in time, capturing the write data using a register.

16. The method of claim 14, wherein initiating coupling to the power supply node includes activating a particular word line of a plurality of word lines, and wherein initiating de-coupling from the power supply node includes de-activating the particular word line.

17. The method of claim 16, wherein initiating the transfer of the portion of the write data includes activating a particular local clock signal of a plurality of local clock signals using the particular word line.

18. The method of claim 17, wherein activating the particular word line includes activating the particular word line in response to a first transition of a global clock signal.

19. The method of claim 18, wherein activating the particular local clock signal includes producing a falling transition of the particular local clock signal; wherein activating the particular local clock signal is in response to a second transition of the global clock signal; and wherein the second transition of the global clock signal is subsequent to the first transition of the global clock signal.

20. The method of claim 19, further comprising delaying the de-activating of the particular word line with respect to the second transition of the global clock signal.

* * * * *